United States Patent
Shishikura

(10) Patent No.: US 10,714,465 B2
(45) Date of Patent: Jul. 14, 2020

(54) MOTOR DRIVE CIRCUIT, SEMICONDUCTOR APPARATUS, AND ELECTRONIC DEVICE

(71) Applicant: SEIKO EPSON CORPORATION, Tokyo (JP)

(72) Inventor: Isao Shishikura, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/114,913

(22) Filed: Aug. 28, 2018

(65) Prior Publication Data

US 2019/0067267 A1 Feb. 28, 2019

(30) Foreign Application Priority Data

Aug. 30, 2017 (JP) .................................. 2017-165168
Mar. 22, 2018 (JP) .................................. 2018-053970

(51) Int. Cl.
*H01L 27/02* (2006.01)
*H01L 27/092* (2006.01)
(Continued)

(52) U.S. Cl.
CPC ........ *H01L 27/0207* (2013.01); *H01L 27/092* (2013.01); *H02M 7/219* (2013.01); *H02M 7/53871* (2013.01); *H02P 7/04* (2016.02); *H03K 17/0828* (2013.01); *H01L 21/823878* (2013.01); *H03K 17/0822* (2013.01); *H03K 17/6872* (2013.01)

(58) Field of Classification Search
CPC .............. H01L 27/0207; H01L 27/092; H01L 21/823878; H02M 7/53871; H02M 7/219; H02P 7/04; H02P 27/06; H03K 17/0828; H03K 17/6872; H03K 17/0822

See application file for complete search history.

(56) References Cited

U.S. PATENT DOCUMENTS 6,234,084 B1 11/2001 Fujisawa
9,915,967 B2 * 3/2018 Moriya ..................... G05F 3/16
(Continued)

FOREIGN PATENT DOCUMENTS

JP 2000-311953 A 11/2000
JP 2003-309978 A 10/2003
JP 2009-181996 A 8/2009

Primary Examiner — Marcos D. Pizarro
Assistant Examiner — Sue Tang
(74) Attorney, Agent, or Firm — Oliff PLC

(57) ABSTRACT

An H bridge circuit that is connected to nodes N1 and N2 for a power source and nodes N3 and N4 for a motor includes: a PchMOS transistor that is disposed in an N-type first region and is connected between N1 and N3; an NchMOS transistor that is disposed in an N-type second region and is connected between N2 and N3; a PchMOS transistor that is disposed in an N-type third region and is connected between N1 and N4; and an NchMOS transistor that is disposed in an N-type fourth region and is connected between N2 and N4, in a P-type semiconductor substrate. The distance between the first region and third region is smaller than the distance between the first region and second region, smaller than the distance between the third region and fourth region, and smaller than the distance between the second region and fourth region.

21 Claims, 12 Drawing Sheets

(51) Int. Cl.
    *H03K 17/082*     (2006.01)
    *H02P 7/03*     (2016.01)
    *H02M 7/219*     (2006.01)
    *H02M 7/5387*     (2007.01)
    *H03K 17/687*     (2006.01)
    *H01L 21/8238*     (2006.01)

(56) References Cited

U.S. PATENT DOCUMENTS

| | | | |
|---|---|---|---|
| 2008/0174359 A1* | 7/2008 | Osada | H03K 19/0008 327/534 |
| 2008/0252372 A1* | 10/2008 | Williams | H01L 27/092 330/251 |
| 2009/0189676 A1 | 7/2009 | Araki | |
| 2015/0234411 A1* | 8/2015 | Moriya | G05F 3/16 323/313 |

* cited by examiner

MOTOR DRIVE CIRCUIT, SEMICONDUCTOR APPARATUS, AND ELECTRONIC DEVICE

This application claims priority to Japanese Patent Application 2017-165168 filed Aug. 30, 2017 and Japanese Patent Application 2018-053970 filed Mar. 22, 2018. The disclosure of those prior applications is hereby incorporated in its entirety herein.

BACKGROUND

1. Technical Field

The present invention relates to a motor drive circuit for driving a motor. Furthermore, the invention relates to a semiconductor apparatus including this kind of motor drive circuit, an electronic device in which this kind of semiconductor apparatus is used, and the like.

2. Related Art

For example, in a motor driver IC, a DC motor is driven using a motor drive circuit having a bridge circuit that is constituted by connecting high-side transistors and low-side transistors in series. In general, two sets of high-side and low-side transistors are combined to form an H bridge circuit (also referred to as a full bridge circuit), and two terminals of a motor are connected to the connection point of a first set of transistors and the connection point of a second set of transistors. Accordingly, the direction of the current that flows in the motor can be set appropriately.

In order to cause a large current to flow in the motor, the high-side transistors are constituted by P-channel ED (Extended Drain) MOS transistors and the low-side transistors are constituted by N-channel LD (Lateral Double-diffused) MOS transistors. In this case, the high-side transistors and the low-side transistors are respectively disposed in N-type first impurity regions and N-type second impurity regions, which are provided in a P-type semiconductor substrate, for example. As a result, a parasitic NPN bipolar transistor is formed with the N-type first impurity region serving as the collector, the P-type semiconductor substrate serving as the base, and the N-type second impurity region serving as the emitter.

The first impurity region is supplied with a high-potential-side power source potential (e.g., +42 V) and the second impurity region is supplied with a low-potential-side power source potential (e.g., 0 V). The N-type drain of the low-side transistor is disposed in the second impurity region, and one terminal of the motor is electrically connected to the drain. When a regenerative current flows in a highspeed attenuation (decay) mode, a negative potential (e.g., about −1 V) is applied from one terminal of the motor to the second impurity region.

Accordingly, current flows from the base to the emitter of the parasitic transistor, and the parasitic transistor turns on. If the hFE (DC current amplification ratio) of the parasitic transistor is large, a large parasitic current exceeding an allowable limit flows, causing structural breakdown of the IC in some cases. In a known technique, a countermeasure for sufficiently obtaining distances between multiple transistors has been taken in order to suppress the hFE of the parasitic transistor to an allowable value or less.

As a related technique, JP-A-2009-181996 (paragraphs 0001, 0002, 0049, and 0050, FIG. 8) discloses a semiconductor apparatus that is constituted by four power transistors per channel and includes an H bridge circuit that is used for drive control of the motor. In FIG. 8 of JP-A-2009-181996, all of the intervals in the lateral direction and the intervals in the vertical direction of cell portions 21, 22, 25, and 26, which correspond to the four power transistors constituting an H bridge circuit, are equal, and are denoted by Z.

Also, JP-A-2003-309978 (paragraphs 0001 to 0003, 0069, and 0070, FIG. 2) discloses a power supply apparatus that includes a bridge rectifying circuit constituted by four transistors, rectifies an AC voltage, and supplies DC power. In paragraphs 0069 and 0070 and FIG. 2 of JP-A-2003-309978, it is disclosed that, as a countermeasure against latchup, which is caused by a parasitic transistor turning on, P-channel transistors P1 and P2 are surrounded by a high-potential-side power source wire LVdd, N-channel transistors N3 and N4 are surrounded by a low-potential-side power source wire LVss, and the distances between the transistors P1, P2, N3, and N4 are sufficiently separated and partitioned.

JP-A-2009-181996A and JP-A-2003-309978 are examples of related art.

However, when multiple transistors are separated from each other with sufficient distance between the transistors as disclosed in JP-A-2003-309978, latchup that is caused by a parasitic transistor turning on can be prevented, but the circuit area (chip size) increases. Also, JP-A-2009-181996 and JP-A-2003-309978 do not disclose that the high-side transistors and the low-side transistors are disposed in multiple impurity regions (wells, etc.) of the same conductivity type.

SUMMARY

In view of this, in light of the foregoing points, a first advantage of some aspects of the invention is to suppress an increase in the circuit area while preventing structural breakdown caused by a parasitic bipolar transistor turning on, the parasitic bipolar transistor being formed by multiple impurity regions of the same conductivity type in which multiple transistors that form an H-bridge circuit are disposed or formed, and a semiconductor substrate of the opposite conductivity type, in a motor drive circuit. Also, a second advantage of some aspects of the invention is to provide a semiconductor apparatus including this kind of motor drive circuit. Furthermore, a third advantage of some aspects of the invention is to provide an electronic device or the like in which this kind of semiconductor apparatus is used.

In order to solve at least part of the foregoing problem, a motor drive circuit according to a first aspect of the invention includes: a motor drive circuit including a first H bridge circuit that is connected to a first node to which a first power source potential is supplied, a second node to which a second power source potential that is lower than the first power source potential is supplied, and a third node and fourth node that are respectively connected to two terminals of a motor to be driven. The first H bridge circuit includes: a first P-channel MOS transistor that is disposed in an N-type first impurity region in a P-type semiconductor substrate and is connected between the first node and the third node; a first N-channel MOS transistor that is disposed in an N-type second impurity region in the semiconductor substrate or is disposed directly in the semiconductor substrate and includes an N-type second impurity region, and that is connected between the second node and the third node; a second P-channel MOS transistor that is disposed in an N-type third impurity region in the semiconductor substrate and is connected between the first node and the fourth node; and a second N-channel MOS transistor that is disposed in an N-type fourth impurity region in the semiconductor substrate or is disposed directly in the semiconductor substrate and includes an N-type fourth impurity region, and that is connected between the second node and the fourth node. A distance between the first impurity region and the third impurity region is smaller than a distance between the first impurity region and the second impurity region, smaller than a distance between the third impurity region and the fourth impurity region, and smaller than a distance between the second impurity region and the fourth impurity region.

Here, the first P-channel MOS transistor may be an EDMOS transistor, the second P-channel MOS transistor may be an EDMOS transistor, the first N-channel MOS transistor may be an LDMOS transistor, and the second N-channel MOS transistor may be an LDMOS transistor.

Also, a motor drive circuit according to a second aspect of the invention includes: a first H bridge circuit that is connected to a first node to which a first power source potential is supplied, a second node to which a second power source potential that is lower than the first power source potential is supplied, and a third node and fourth node that are respectively connected to two terminals of a motor to be driven. The first H bridge circuit includes: a first N-channel EDMOS transistor that is disposed in a P-type first impurity region in an N-type semiconductor substrate and is connected between the second node and the third node; a first P-channel LDMOS transistor that is disposed in a P-type second impurity region in the semiconductor substrate and is connected between the first node and the third node; a second N-channel EDMOS transistor that is disposed in a P-type third impurity region in the semiconductor substrate and is connected between the second node and the fourth node; and a second P-channel LDMOS transistor that is disposed in a P-type fourth impurity region in the semiconductor substrate and is connected between the first node and the fourth node. A distance between the first impurity region and the third impurity region is smaller than a distance between the first impurity region and the second impurity region, smaller than a distance between the third impurity region and the fourth impurity region, and smaller than a distance between the second impurity region and the fourth impurity region.

According to the first and second aspects of the invention, in a motor drive circuit, the hFE (DC current amplification ratio) of a parasitic bipolar transistor formed by multiple impurity regions of the same conductivity type in which multiple transistors that constitute an H bridge circuit are disposed or formed and a semiconductor substrate of the opposite conductivity type is suppressed to an allowable value or less to prevent structural breakdown caused by the parasitic transistor turning on, and the distance between a first impurity region and a third impurity region, in which a parasitic transistor is not likely to turn on during a circuit operation, is reduced, whereby it is possible to suppress an increase in circuit area and to suppress cost.

Here, the distance between the first impurity region and the second impurity region, the distance between the third impurity region and the fourth impurity region, and the distance between the second impurity region and the fourth impurity region may be equal to each other. Accordingly, the hFEs of the parasitic transistors that are formed between the first impurity region and the second impurity region, between the third impurity region and the fourth impurity region, and between the second impurity region and the fourth impurity region are made approximately identical, and thus the layout efficiency can be improved.

Also, the motor drive circuit may further include: at least one first guard region that has the same conductivity type as the semiconductor substrate and extends between the first impurity region and the second impurity region in the semiconductor substrate, along a side of the first impurity region near the second impurity region and a side of the second impurity region near the first impurity region; at least one second guard region that has the same conductivity type as the semiconductor substrate and extends between the third impurity region and the fourth impurity region in the semiconductor substrate, along a side of the third impurity region near the fourth impurity region and a side of the fourth impurity region near the third impurity region; and at least one third guard region that has the same conductivity type as the semiconductor substrate and extends between the second impurity region and the fourth impurity region in the semiconductor substrate, along a side of the second impurity region near the fourth impurity region and a side of the fourth impurity region near the second impurity region. Accordingly, it is possible to prevent a depletion layer from widening and causing punchthrough between the first impurity region and the second impurity region, between the third impurity region and the fourth impurity region, and between the second impurity region and the fourth impurity region.

In this case, the motor drive circuit may include: a plurality of the first guard regions; a plurality of the second guard regions; and a plurality of the third guard regions, and may further include at least one fourth guard region that has the same conductivity type as the semiconductor substrate and extends between the first impurity region and the third impurity region in the semiconductor substrate, along a side of the first impurity region near the third impurity region and a side of the third impurity region near the first impurity region. The number of the fourth guard regions may be smaller than the number of the first guard regions, smaller than the number of the second guard regions, and smaller than the number of the third guard regions. Accordingly, the number of fourth guard regions provided between the first impurity region and the third impurity region in which punchthrough is not likely to occur during a circuit operation can be reduced, and thus an increase in the circuit area can be suppressed.

Alternatively, the motor drive circuit may further include a fourth guard region that has the same conductivity type as the semiconductor substrate and extends between the first impurity region and the third impurity region in the semiconductor substrate, along a side of the first impurity region near the third impurity region and a side of the third impurity region near the first impurity region. The width of the fourth guard region may be smaller than the width of the first guard region, smaller than the width of the second guard region, and smaller than the width of the third guard region. Accordingly, the width of the fourth guard region provided between the first impurity region and the third impurity region in which punchthrough is not likely to occur during a circuit operation can be reduced, and thus an increase in the circuit area can be suppressed.

In the above description, the motor drive circuit may further include a second H bridge circuit having the same configuration as the first H bridge circuit. The distance between the first to fourth impurity regions of the first H bridge circuit and the first to fourth impurity regions of the second H bridge circuit may be greater than or equal to the distance between the second impurity region and the fourth impurity region of the first or second H bridge circuit. Accordingly, the hFE of a parasitic bipolar transistor formed by the multiple impurity regions of the same conductivity type in which multiple transistors that constitute the first and second H bridge circuits are disposed or formed and the semiconductor substrate of the opposite conductivity type can be suppressed to an allowable value or less to prevent structural breakdown caused by the parasitic transistor turning on.

Alternatively, the motor drive circuit may further include: (Claim 9). Accordingly, punchthrough between the first H bridge circuit and the second H bridge circuit can be effectively prevented.

Alternatively, the motor drive circuit may further include: a second H bridge circuit having the same configuration as the first H bridge circuit; and a plurality of fifth guard regions that have the same conductivity type as the semiconductor substrate and extend between the first H bridge circuit and the second H bridge circuit in the semiconductor substrate. The number of the fifth guard regions may be greater than or equal to the number of the first guard regions, greater than or equal to the number of the second guard regions, and greater than or equal to the number of the third guard regions. Accordingly, punchthrough between the first H bridge circuit and the second H bridge circuit can be effectively prevented.

A semiconductor apparatus according to a third aspect of the invention includes: any of the above-described motor drive circuits; a drive control circuit including a transistor that is disposed in a fifth impurity region in the semiconductor substrate, or is disposed directly in the semiconductor substrate and includes a fifth impurity region; and a switching regulator control circuit including a transistor that is disposed in a sixth impurity region in the semiconductor substrate, or is disposed directly in the semiconductor substrate and includes a sixth impurity region. The distance between the fifth impurity region and the first to fourth impurity regions is greater than or equal to the distance between the second impurity region and the fourth impurity region, and the distance between the sixth impurity region and the first to fourth impurity regions is greater than or equal to the distance between the second impurity region and the fourth impurity region.

According to the third aspect of the invention, it is possible to provide: a motor drive circuit in which an increase in the circuit area is suppressed while preventing structural breakdown caused by a parasitic transistor turning on, the parasitic transistor being formed by multiple impurity regions of the same conductivity type in which multiple transistors that constitute an H bridge circuit are disposed or formed and a semiconductor substrate of an opposite conductivity type; and a semiconductor apparatus including a drive control circuit and a switching regulator control circuit, which are not likely to be influenced by noise even if the motor drive circuit performs a switching operation.

An electronic device according to a fourth aspect of the invention includes: any of the above-described motor drive circuits; and the motor including the two terminals that are respectively connected to the third node and the fourth node.

According to the fourth aspect of the invention, it is possible to provide a highly-reliable compact electronic device using a motor drive circuit in which an increase in the circuit area is suppressed while preventing structural breakdown caused by a parasitic transistor turning on, the parasitic transistor being formed by multiple impurity regions of the same conductivity type in which multiple transistors that constitute an H bridge circuit are disposed or formed and a semiconductor substrate of an opposite conductivity type.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the drawings. Note that identical constituent elements are denoted by identical reference signs, and redundant description thereof is omitted.

First Embodiment

Figure 1:
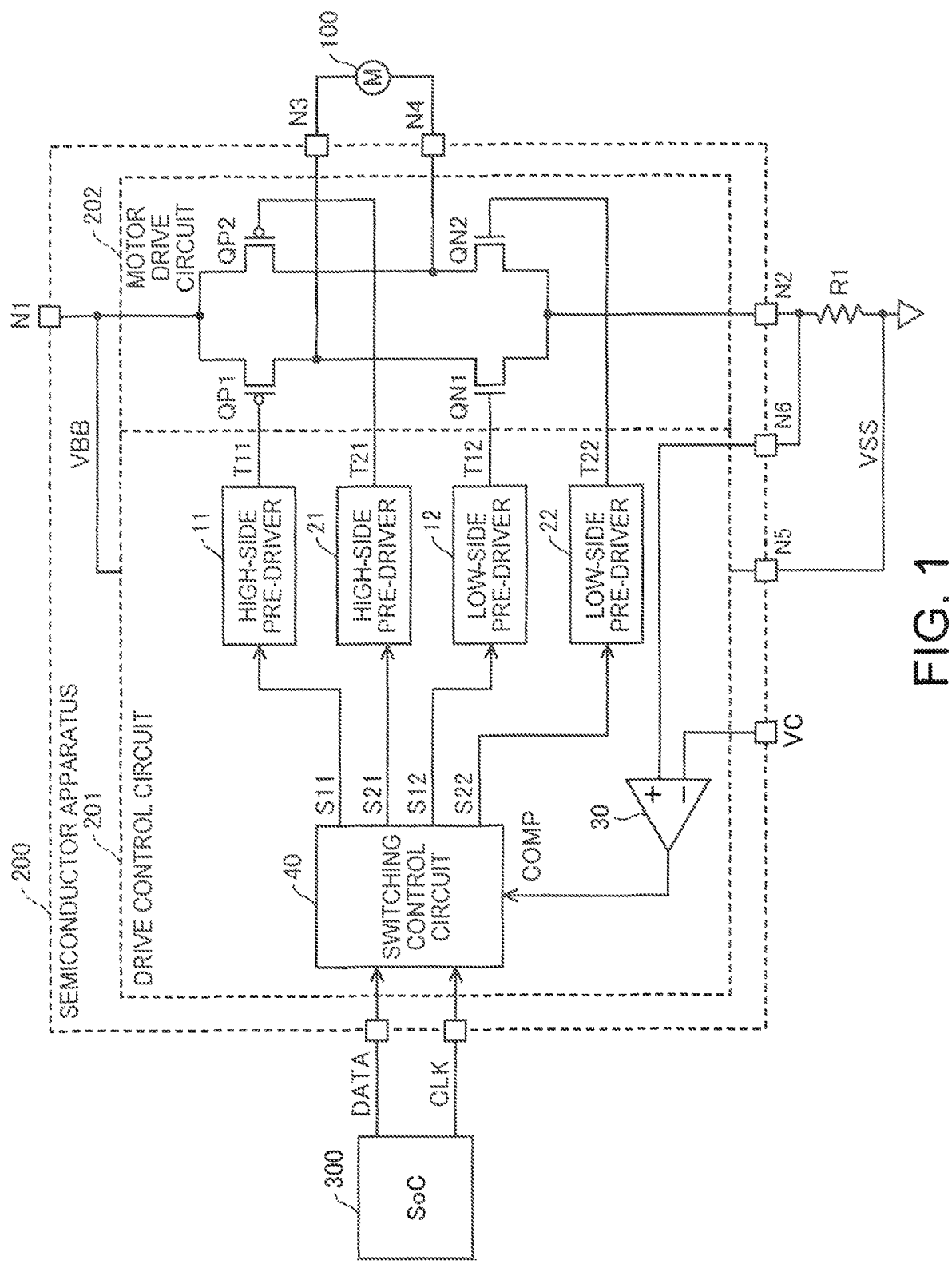
FIG. 1 is a circuit diagram showing a configuration example of part of an electronic device according to a first embodiment of the invention.

FIG. 1 is a circuit diagram showing a configuration example of part of an electronic device according to a first embodiment of the invention. A printer, a scanner, a projector, or the like including a motor are examples of the electronic device, but hereinafter a printer will be described as an example.

As shown in FIG. 1, this electronic device includes a motor 100, a semiconductor apparatus (motor driver IC) 200 according to a first embodiment of the invention, a SoC (System on a Chip) 300, and a resistor R1. Note that part of the constituent elements shown in FIG. 1 may be omitted or modified, or another constituent element may be added to the constituent elements shown in FIG. 1.

The motor 100 is a DC brush motor, a DC brushless motor, a stepping motor, or the like. For example, the motor 100 is used to move a carriage on which a printing head of the printer is mounted, or to convey a printing medium (sheet, etc.) that is to be printed on using ink discharged from the printing head.

A semiconductor apparatus 200 includes a drive control circuit 201 and a motor drive circuit 202 that drives the motor 100 under the control of the drive control circuit 201. Note that at least some of the constituent elements of the drive control circuit 201 and the motor drive control circuit 202 may be constituted by discreet components.

For example, the semiconductor apparatus 200 is constituted by storing, in a package, an IC chip obtained by forming a circuit on a silicon substrate. In this case, a first node N1 to a sixth node N6 of the semiconductor apparatus 200 may be pads (terminals) of an IC chip or pins (terminals) provided in a package.

The resistor R1 is a resistor for measuring the drive current that flows in the motor drive circuit 202, and for example, has a small resistance of about 1Ω. In FIG. 1, the resistor R1 is shown as a externally-attached component of the semiconductor apparatus 200, but the resistor R1 may also be included in the semiconductor apparatus 200. Alternatively, if another means is used to measure the drive current, the resistor R1 may be omitted.

The SoC 300 includes a processor, a memory, and the like, and controls the units of the electronic device. Note that "SoC" refers to a semiconductor apparatus in which a series of functions (system) that are required in an electronic device or the like are integrated in one semiconductor chip. The SoC 300 supplies control data DATA that is needed to control the motor 100 to the semiconductor apparatus 200 along with a clock signal CLK by performing communication with the semiconductor apparatus 200 using a serial interface method.

Configuration of Motor Driver

The motor drive circuit 202 includes an H bridge circuit that is connected to a first node N1 to which a first power source potential VBB (e.g., +42 V) is supplied, a second node N2 to which a second power source potential VSS (in FIG. 1, the ground potential 0 V) that is lower than the first power source potential VBB is applied, and a third node N3 and fourth node N4 that are respectively connected to two terminals of the motor 100 that is to be driven.

A second power source potential VSS is supplied to a fifth node N5 as well. As shown in FIG. 1, if the resistor R1 is connected between the fifth node N5 and the second node N2, the second power source potential VSS is supplied to the second node N2 via the resistor R1.

The H bridge circuit includes: a first P-channel MOS transistor QP1 that is connected between the first node N1 and the third node N3; and a first N-channel MOS transistor QN1 that is connected between the second node N2 and the third node N3. The H bridge circuit includes: a second P-channel MOS transistor QP2 that is connected between the first node N1 and the fourth node N4; and a second N-channel MOS transistor QN2 that is connected between the second node N2 and the fourth node N4.

In the first embodiment, the first P-channel MOS transistor QP1 is an EDMOS transistor, the second P-channel MOS transistor QP2 is an EDMOS transistor, the first N-channel MOS transistor QN1 is an LDMOS transistor, and the second N-channel MOS transistor QN2 is an LDMOS transistor.

The high-side transistor QP1 has a source that is connected to the first node N1, a drain that is connected to the third node N3, and a gate to which a drive signal T11 is supplied. The low-side transistor QN1 includes a drain that is connected to the third node N3, a source that is connected to the second node N2, and a gate to which a drive signal T12 is supplied.

Also, the high-side transistor QP2 includes a source that is connected to the first node N1, a drain that is connected to the fourth node N4, and a gate to which a drive signal T21 is supplied. The low-side transistor QN2 includes a drain that is connected to the fourth node N4, a source that is connected to the second node N2, and a gate to which a drive signal T22 is supplied.

The drive control circuit 201 includes a high-side pre-driver 11 that generates the drive signal T11 in accordance with a control signal S11, a low-side pre-driver 12 that generates the drive signal T12 in accordance with a control signal S12, a high-side pre-driver 21 that generates the drive signal T21 in accordance with a control signal S21, and a low-side pre-driver 22 that generates the drive signal T22 in accordance with a control signal S22.

Furthermore, the drive control circuit 201 includes a comparator 30 and a switching control circuit 40. The comparator 30 compares the voltage generated between both ends of the resistor R1 when current flows in the motor 100 with a set control voltage VC, and generates a comparison result signal COMP indicating the comparison result.

The switching control circuit 40 is constituted by a logical circuit including, for example, an RS-type flip flop or the like. The switching control circuit 40 operates in accordance with data DATA and a clock signal CLK supplied from the SoC 300, and performs pulse width modulation (PWM) based on a comparison result signal COMP that is output from the comparator 30, whereby the control signals S11 to S22 with modulated pulse widths are generated. Accordingly, the current that flows in the motor 100 can be controlled.

Operation of Motor Driver

Figure 2:
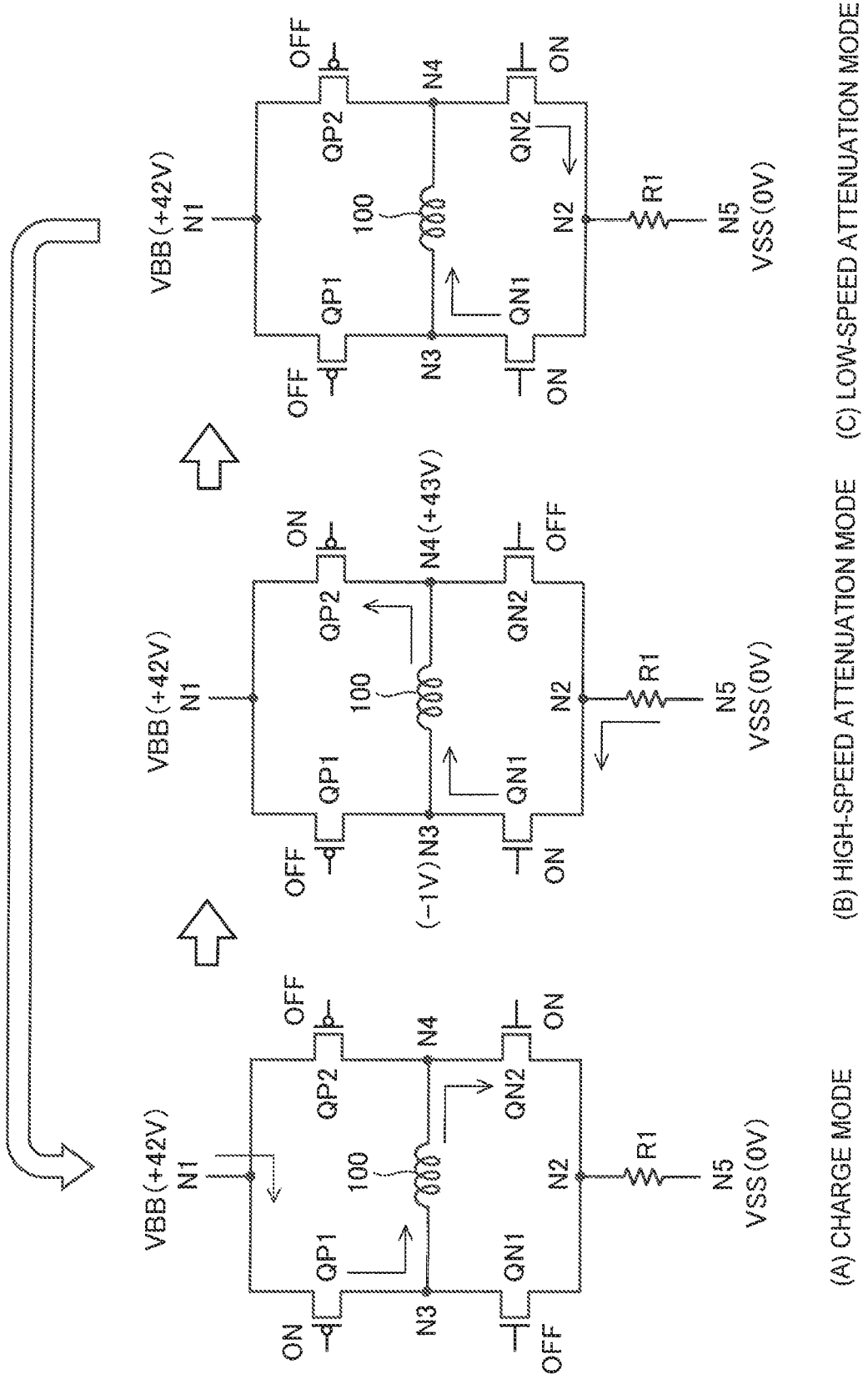
FIG. 2 is a circuit diagram for describing an example of an operation of a motor drive circuit shown in FIG. 1.

FIG. 2 is a circuit diagram for describing an example of an operation of the motor drive circuit shown in FIG. 1. The motor 100 has an inductance component, and therefore it is denoted by the symbol for an inductor in FIG. 2. The motor 100 has two terminals that are respectively connected to the third node N3 and the fourth node N4.

In the charge mode shown in FIG. 2A, the transistors QP1 and QN2 are controlled to the on state (ON), and the transistors QN1 and QP2 are controlled to the off state (OFF). Accordingly, the current flows from the first node N1 to the fifth node N5 via the transistor QP1, the motor 100, the transistor QN2, and the resistor R1, and thus the motor 100 rotates.

In the charge mode, the current that flows in the motor 100 gradually increases, and the voltage between both ends of the resistor R1 also gradually rises. In order to control the rotation rate or torque of the motor 100, the transistors QP1 and QN2 are intermittently put in the on state. If the voltage between both ends of the resistor R1 becomes larger than the control voltage VC, the comparison result signal COMP of the comparator 30 is activated at the high level. Accordingly, the switching control circuit 40 transitions from the charge mode to a high-speed attenuation mode.

In the high-speed attenuation mode shown in FIG. 2B, the transistors QP1 and QN2 are controlled to the off state and the transistors QN1 and QP2 are controlled to the on state. Alternatively, if a parasitic diode in the forward direction from the source to the drain of the transistor QN1 exists and a parasitic diode in the forward direction from the drain to the source of the transistor QP2 exists, the transistors QN1 and QP2 may be controlled to the off state.

In the high-speed attenuation mode, the current flows from the fifth node N5 to the first node N1 via the resistor R1, the transistor QN1, the motor 100, and the transistor QP2, due to the counter-electromotive force of the motor 100. Accordingly, speed adjustment of the motor 100 is performed and a power regeneration operation is performed. At this time, for example, the potential of the third node N3 falls to about −1 V, and the potential of the fourth node N4 rises to about +43 V. In this manner, a negative potential is applied to the drains of the transistors QP1 and QN1 that are electrically connected to the third node N3.

Since the energy accumulated in the motor 100 is discharged due to the power regeneration operation, the current that flows in the motor 100 gradually decreases. For example, if the current that flows in the motor 100 approaches zero or a certain period elapses from the start of the high-speed attenuation mode, the switching control circuit 40 performs a transition from the high-speed attenuation mode to a low-speed attenuation mode. Note that the switching control circuit 40 may omit the low-speed attenuation mode and restart the charge mode.

In the low-speed attenuation mode shown in FIG. 2C, the transistors QP1 and QP2 are controlled to the off state and the transistors QN1 and QN2 are controlled to the on state. Alternatively, if a parasitic diode in the forward direction from the source to the drain of the transistor QN1 exists, the transistor QN1 may be controlled to the off state.

In the low-speed attenuation mode, the current flows from the fourth node N4 to the third node N3 via the transistors QN2 and QN1 due to the counter-electromotive force of the motor 100. Accordingly, a brake is applied to the motor 100 and the energy accumulated in the motor 100 is emitted, and therefore the current that flows in the motor 100 gradually decreases.

For example, if the current that flows in the motor 100 approaches zero or a certain period elapses from the start of the low-speed attenuation mode, the switching control circuit 40 performs a transition from the low-speed attenuation mode to the charge mode. Thereafter, the charge mode and the attenuation mode are repeated to perform control in which the peak value of the current that flows in the motor 100 is constant, and thus the rotation speed or the torque of the motor 100 is kept approximately constant.

On the other hand, the transistors QN1 and QP2 are controlled to the on state and the transistors QP1 and QN2 are controlled to the off state, and thus current flows from the first node N1 to the fifth node N5 via the transistor QP2, the motor 100, the transistor QN1, and the resistor R1 and the motor 100 reverses. Even if the motor 100 is reversed, it is possible to keep the rotation speed or torque of the motor 100 approximately constant by performing control similar to that in the case of rotating the motor 100 normally.

Specific Example of Motor Drive Circuit

Figure 3:
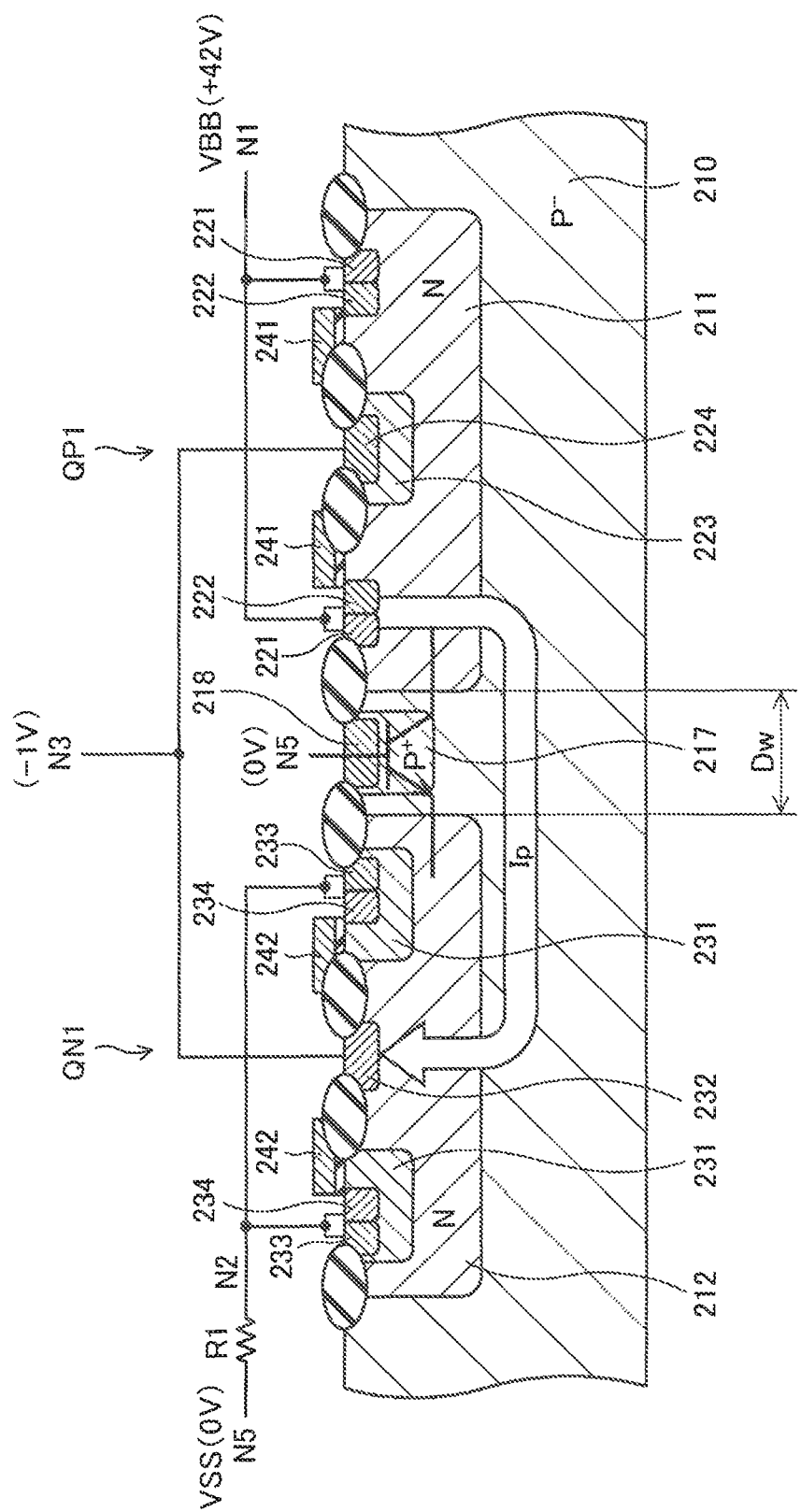
FIG. 3 is a cross-sectional diagram showing a specific example of the motor drive circuit shown in FIG. 1.

FIG. 3 is a cross-sectional diagram showing a specific example of the motor drive circuit shown in FIG. 1. In the specific example shown in FIG. 3, a P-type semiconductor substrate (e.g., a silicon substrate including a P-type impurity such as boron) 210 is used. The first P-channel MOS transistor QP1 is an EDMOS transistor, and is disposed in an N-type first impurity region 211 in the semiconductor substrate 210. Also, the first N-channel MOS transistor QN1 is an LDMOS transistor, and is disposed in an N-type second impurity region 212 in the semiconductor substrate 210.

Although not shown in FIG. 3, the second P-channel MOS transistor QP2 is an EDMOS transistor and is disposed in an N-type third impurity region in the semiconductor substrate 210. Also, the second N-channel MOS transistor QN2 is an LDMOS transistor, and is disposed in an N-type fourth impurity region in the semiconductor substrate 210. Hereinafter, a configuration of the transistors QP1 and QN1 will be described as an example, but the transistors QP2 and QN2 also have similar configurations thereto.

An N-type contact region 221, a P-type impurity region 222 constituting the source of the transistor QP1, a P-type impurity region 223 constituting an extended drain of the transistor QP1, and a P-type impurity region 224 constituting the drain of the transistor QP1 are disposed in the first impurity region 211. The P-type impurity region 224 has an impurity concentration that is higher than that of the P-type impurity region 223.

A P-type body region 231 and an N-type impurity region 232 constituting the drain of the transistor QN1 are disposed in the second impurity region 212. A P-type contact region 233 and an N-type impurity region 234 constituting the source of the transistor QN1 are disposed in the P-type body region 231.

A P-type impurity region (P+) 217 having a higher impurity concentration than the semiconductor substrate 210 is disposed between the first impurity region 211 and the second impurity region 212 in the semiconductor substrate 210 and a P-type contact region 218 is disposed in the P-type impurity region 217. The P-type impurity region 217 corresponds to a guard region for preventing the depletion layer from widening and causing punchthrough between the first impurity region 211 and the second impurity region 212.

Also, a gate electrode 241 of the transistor QP1 and a gate electrode 242 of the transistor QN1 are disposed on the semiconductor substrate 210 via a gate insulating film. Furthermore, a wiring layer including multiple wires is disposed via an interlayer insulating film on the semiconductor substrate 210 on which the gate electrodes 241 and 242 and the like are disposed. The interlayer insulating film and the wiring layer may have multilayer structures as needed.

The N-type contact region 221 and the P-type impurity region 222 are connected to the first node N1 via wiring. The P-type contact region 218 is connected to the fifth node N5 via wiring. The P-type contact region 233 and the N-type impurity region 234 are connected to the second node N2 via wiring. The P-type impurity region 224 and the N-type impurity region 232 are connected to the third node N3 via wiring.

Here, as shown in FIG. 3, a parasitic NPN bipolar transistor is formed with the N-type first impurity region 211 serving as the collector, the P-type semiconductor substrate 210 serving as the base, and the N-type second impurity region 212 serving as the emitter. The first power source potential VBB (e.g., +42 V) is supplied from the first node N1 to the first impurity region 211 via the N-type contact region 221 and the second power source potential VSS (e.g., 0 V) is supplied from the fifth node N5 to the semiconductor substrate 210 via the P-type contact region 218 and the P-type impurity region 217.

In the high-speed attenuation mode shown in FIG. 2B, when a regenerative current flows from the fifth node N5 to the first node N1 via the transistors QN1 and QP2 and the like, a negative potential (e.g., about −1 V) is applied to the third node N3. Accordingly, a negative potential is applied from the third node N3 to the second impurity region 212 via the N-type impurity region 232.

Thus, the parasitic transistor turns on and the parasitic current Ip flows from the first impurity region 211 to the second impurity region 212 via the semiconductor substrate 210. If the hFE (DC current amplification ratio) of the parasitic transistor is large, a large parasitic current Ip exceeding an allowable limit flows, causing structural breakdown of the IC in some cases.

Figure 4:
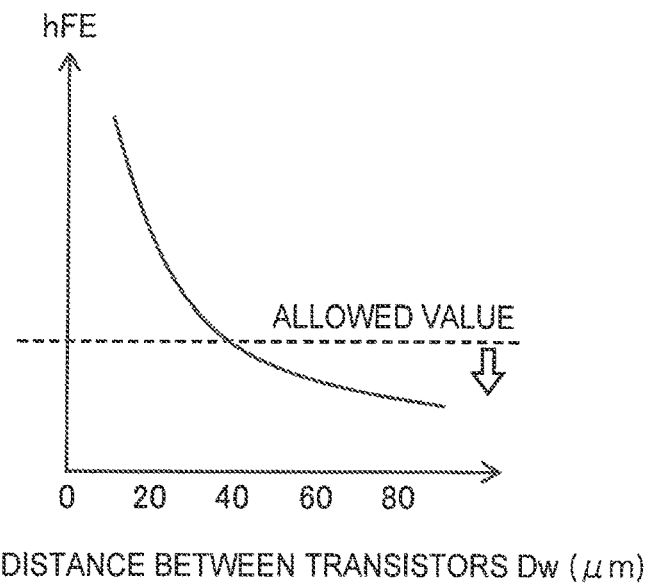
FIG. 4 is a diagram showing an example of change in hFE of a parasitic transistor.

FIG. 4 is a diagram showing an example of a change in the hFE of the parasitic transistor with respect to the distance between the two transistors shown in FIG. 3. In FIG. 4, the horizontal axis indicates the distance Dw between the first impurity region 211 in which the transistor QP1 shown in FIG. 3 is disposed and the second impurity region 212 in which the transistor QN1 is disposed, and the vertical axis indicates the hFE of the parasitic transistor.

As shown in FIG. 4, the smaller the distance Dw between the first impurity region 211 and the second impurity region 212 is, the larger the hFE of the parasitic transistor is. Accordingly, by setting the distance Dw between the first impurity region 211 and the second impurity region 212 to be a predetermined distance or more, it is possible to suppress the hFE of the parasitic transistor to an allowable value or less, at which no structural breakdown of the IC occurs. In the example shown in FIG. 4, if the distance Dw between the first impurity region 211 and the second impurity region 212 is set to about 40 μm or more, the hFE of the parasitic transistor can be suppressed to an allowable value or less.

Layout

Figure 5:
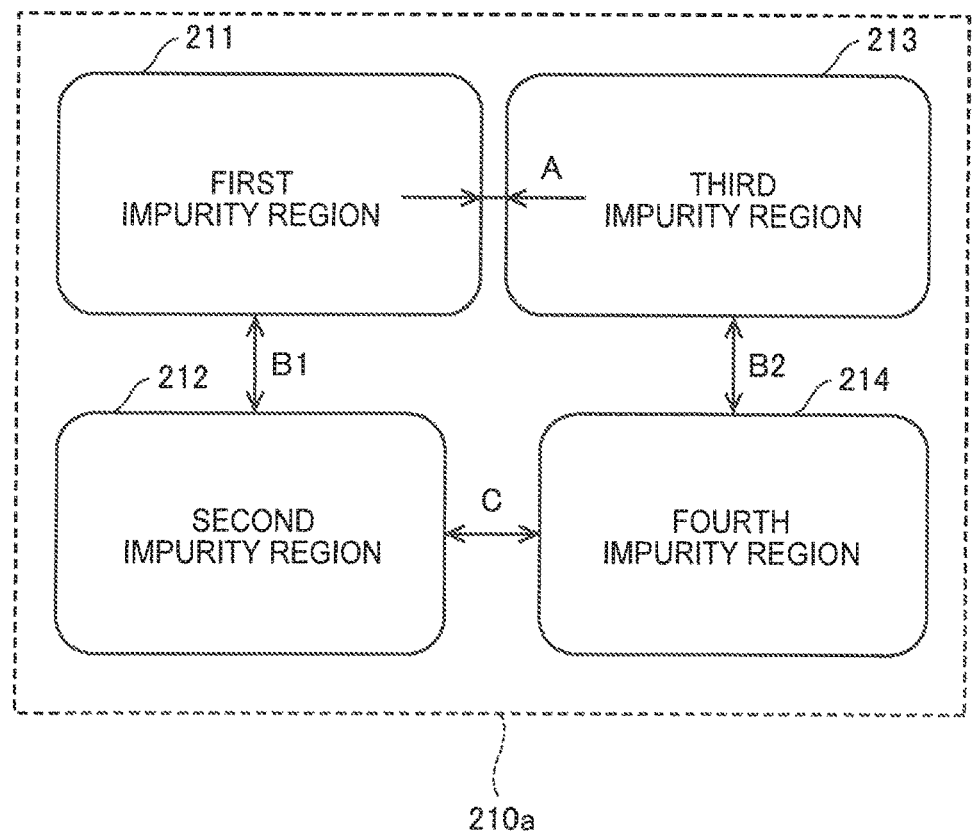
FIG. 5 is a plan view showing an example of a layout of the motor drive circuit shown in FIG. 1.

FIG. 5 is a plan view showing an example of a layout of a motor drive circuit shown in FIG. 1. FIG. 5 shows a layout region 210a of an H bridge circuit in a semiconductor substrate 210. A first impurity region 211 in which the transistor QP1 is disposed, a second impurity region 212 in which the transistor QN1 is disposed, a third impurity region 213 in which the transistor QP2 is disposed, and a fourth impurity region 214 in which the transistor QN2 is disposed are set in the layout region 210a.

The second power source potential VSS is supplied to the semiconductor substrate 210 and the first power source potential VBB is supplied to the first impurity region 211 and the third impurity region 213. Accordingly, there is a low likelihood that a parasitic NPN bipolar transistor formed by the N-type first impurity region 211, the P-type semiconductor substrate 210, and the N-type third impurity region 213 will turn on.

Accordingly, it is possible to set the distance A between the first impurity region 211 and the third impurity region 213 to be smaller than the predetermined distance. The distance A is set based on various device characteristic values, such as pressure resistance, of the PN junction. Note that in the present application, "distance" means the minimum distance between two regions.

On the other hand, if a negative potential is applied to the second impurity region 212 in the high-speed attenuation mode shown in FIG. 2B, there is a risk that the parasitic NPN bipolar transistor formed by the N-type first impurity region 211, the P-type semiconductor substrate 210, and the N-type second impurity region 212 will turn on. Accordingly, the distance B1 between the first impurity region 211 and the second impurity region 212 needs to be set to the predetermined distance or more.

Similarly, if a negative potential is applied to the fourth impurity region 214 in the high-speed attenuation mode, there is a risk that a parasitic NPN bipolar transistor formed by the N-type third impurity region 213, the P-type semiconductor substrate 210, and the N-type fourth impurity region 214 will turn on. Accordingly, the distance B2 between the third impurity region 213 and the fourth impurity region 214 needs to be set to the predetermined distance or more.

Also, if a negative potential is applied to the second impurity region 212 and a positive potential is applied to the fourth impurity region 214 in the high-speed attenuation mode, and if a positive potential is applied to the second impurity region 212 and a negative potential is applied to the fourth impurity region 214, there is a risk that a parasitic NPN bipolar transistor formed by the N-type second impurity region 212, the P-type semiconductor substrate 210, and the N-type fourth impurity region 214 will turn on. Accordingly, the distance C between the second impurity region 212 and the fourth impurity region 214 needs to be set to the predetermined distance or more.

The following equations (1) to (3) are derived based on the description above.

$$A < B1 \tag{1}$$

$$A < B2 \tag{2}$$

$$A < C \tag{3}$$

That is, in the present embodiment, the distance A between the first impurity region 211 and the third impurity region 213 is set to be smaller than the distance B1 between the first impurity region 211 and the second impurity region 212, smaller than the distance B2 between the third impurity region 213 and the fourth impurity region 214, and smaller than the distance C between the second impurity region 212 and the fourth impurity region 214. For example, the distance A may be set to be ½ or less of the distance B1, ½ or less of the distance B2, and ½ or less of the distance C.

Accordingly, in the motor drive circuit 202, the hFE (DC current amplification ratio) of a parasitic NPN bipolar transistor formed by multiple N type impurity regions in which multiple transistors that constitute an H bridge circuit are disposed and the P-type semiconductor 210 can be suppressed to an allowable value or less to prevent structural breakdown caused by a parasitic transistor turning on, and it is possible to suppress an increase in circuit area and to suppress cost by reducing the distance between the first impurity region 211 and the third impurity region 213, in which a parasitic transistor is not likely to turn on during a circuit operation.

Also, the maximum voltage applied between the first purity region 211 and the second impurity region 212, the maximum voltage applied between the third impurity region 213 and the fourth impurity region 214, and the maximum voltage applied between the second impurity region 212 and the fourth impurity region 214 are approximately equal. Accordingly, as shown in the following equation (4), the distance B1 between the first impurity region 211 and the second impurity region 212, the distance B2 between the third impurity region 213 and the fourth impurity region 214, and the distance C between the second impurity region 212 and the fourth impurity region 214 may be set to be equal to each other.

$$B1 = B2 = C \tag{4}$$

Accordingly, the hFEs of the parasitic transistors formed between the first impurity region 211 and the second impurity region 212, between the third impurity region 213 and the fourth impurity region 214, and between the second impurity region 212 and the fourth impurity region 214 can be made approximately the same, and the layout efficiency can be improved.

Specifically, the distance A may be set to about 20 μm, and the distance B1, the distance B2, and the distance C may each be set to about 60 μm. Note that the boundary of the first impurity region 211 on the left side in the drawing and the boundary of the second impurity region 212 on the left side in the drawing do not need to be on one straight line, and the boundary of the third impurity region 213 on the right side in the drawing and the boundary of the fourth impurity region 214 on the right side in the drawing do not need to be on one straight line.

Second Embodiment

Figure 6:
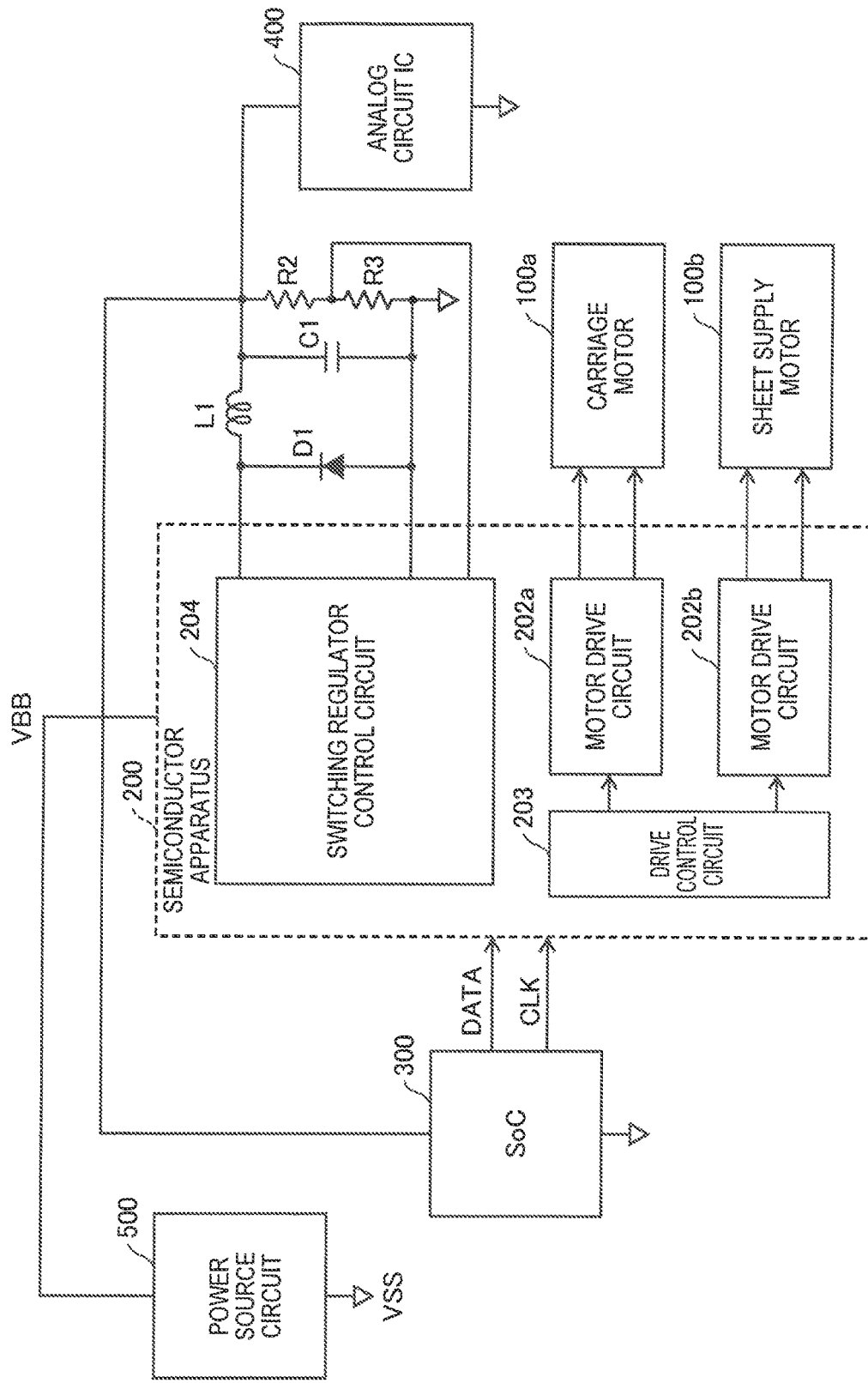
FIG. 6 is a circuit diagram showing an example of a configuration of part of an electronic device according to a second embodiment of the invention.

FIG. 6 is a circuit diagram showing a configuration example of part of an electronic device according to a second embodiment of the invention. As shown in FIG. 6, the electronic device includes at least one motor 100a or 100b, a semiconductor apparatus (motor driver IC) 200 according to a second embodiment of the invention, a SoC 300, an analog circuit IC 400, and a power source circuit 500. Note that part of the constituent elements shown in FIG. 6 may be omitted or modified, or another constituent element may be added to the constituent elements shown in FIG. 6.

The semiconductor apparatus 200 includes at least one motor drive circuit 202a or 202b for driving at least one motor 100a or 100b, and a drive control circuit 203. FIG. 6 shows, as an example, a motor drive circuit 202a that drives a carriage motor 100a for moving a carriage on which a printing head of a printer is mounted, and a motor drive circuit 202b that drives a sheet supply motor 100b for conveying a recording medium (sheet, etc.) to be printed on using ink discharged from the printing head.

The motor drive circuits 202a and 202b respectively include a first H bridge circuit and a second H bridge circuit that are similar to the H bridge circuit of the motor drive circuit 202 of the first embodiment shown in FIG. 1. A resistor R1 (FIG. 1) may be externally attached to each of the motor drive circuits 202a and 202b. The drive control circuit 203 may be constituted by a logical circuit and an analog circuit, may include a two-system drive control circuit 201 (FIG. 1) for controlling the motor drive circuits 202a and 202b, and may further include a control circuit for controlling other portions of the electronic device.

Also, the semiconductor apparatus 200 includes a switching regulator control circuit 204. The switching regulator control circuit 204 is constituted by a logical circuit and an analog circuit, is externally provided with peripheral components such as a diode D1, an inductor L1, a capacitor C1, and resistors R2 and R3, and constitutes a switching regulator. The switching regulator generates a power source voltage (e.g., 3.3 V) that is to be supplied to the SoC 300, the analog circuit IC 400, and the like, by stepping down the power source voltage (e.g., 42 V) that is supplied from the power source circuit 500.

Layout 1

Figure 7:
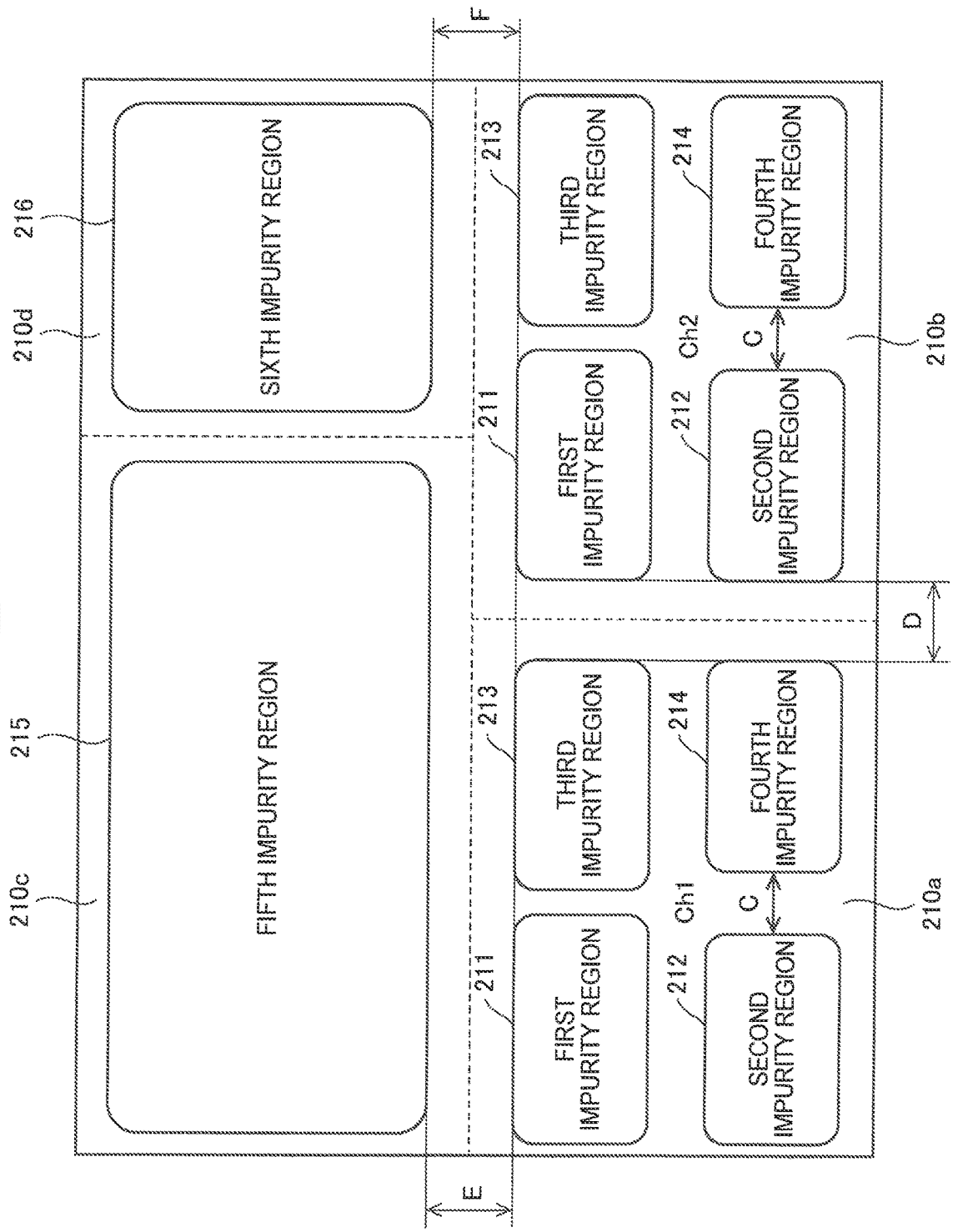
FIG. 7 is a plan view showing a first example of a layout of a semiconductor apparatus shown in FIG. 6.

FIG. 7 is a plan view showing a first example of the layout of the semiconductor apparatus shown in FIG. 6. FIG. 7 shows a layout region 210a in which a first H bridge circuit (Ch1) is disposed, a layout region 210b in which a second H bridge circuit (Ch2) is disposed, a layout region 210c in which a drive control circuit 203 is disposed, and a layout region 210d in which a switching regulator control circuit 204 is disposed, in the semiconductor substrate 210.

Each of the layout regions 210a and 210b is provided with an N-type first impurity region 211 to a fourth impurity region 214. Also, the layout region 210c is provided with an N-type fifth impurity region 215 and the layout region 210d is provided with an N-type sixth impurity region 216. Note that in FIG. 7, the layout region 210a and the layout region 210b are aligned on the left and right in the drawing, but the layout region 210a and the layout region 210b may be aligned in the vertical direction in the drawing. Also, the layout region 210c and the layout region 210d may be inversely disposed, or may be disposed in the vertical direction in the drawing.

In the transistors constituting the first H bridge circuit (Ch1), a first P-channel MOS transistor is disposed in the first impurity region 211 in the layout region 210a and a first N-channel MOS transistor is disposed in the second impurity region 212 in the layout region 210a. Also, a second P-channel MOS transistor is disposed in the third impurity region 213 in the layout region 210a and a second N-channel MOS transistor is disposed in the fourth impurity region 214 in the layout region 210a.

In the transistors constituting the second H bridge circuit (Ch2), a first P-channel MOS transistor is disposed in the first impurity region 211 in the layout region 210b and a first N-channel MOS transistor is disposed in the second impurity region 212 in the layout region 210b. Also, a second P-channel MOS transistor is disposed in the third impurity region 213 in the layout region 210b and a second N-channel MOS transistor is disposed in the fourth impurity region 214 in the layout region 210b.

The conditions of the layout of the first H bridge circuit (Ch1) and the second H bridge circuit (Ch2) are the same as the conditions of the layout of the H bridge circuit of the first embodiment. In FIG. 7, the distance between the second impurity region 212 and the fourth impurity region 214 of the layout regions 210a and 210b are denoted as "C". Also, the distances (minimum distances) between the first impurity region 211 to the fourth impurity region 214 of the first H bridge (Ch1) and the first impurity region 211 to the fourth impurity region 214 of the second H bridge circuit (Ch2) are denoted as "D".

Since the motor drive circuit 202a and the motor drive circuit 202b operate noN-synchronously, in the example shown in FIG. 7, the relationship between the potential of the fourth impurity region 214 in which the second N-channel MOS transistor of the first H bridge circuit (Ch1) is disposed in the layout region 210a and the potential of the second impurity region 212 in which the first N-channel MOS transistor of the second H bridge circuit (Ch2) is disposed in the layout region 210b is not defined.

In view of this, in the present embodiment, the distance D between the first impurity region 211 to the fourth impurity region 214 of the first H bridge circuit (Ch1) and the first impurity region 211 to the fourth impurity region 214 of the second H bridge circuit (Ch2) is set to be greater than or equal to the distance C between the second impurity region 212 and the fourth impurity region 214 in the first H bridge circuit (Ch1) or the second H bridge circuit (Ch2).

Accordingly, the hFE of a parasitic NPN bipolar transistor that is formed by multiple N-type impurity regions in which multiple transistors that constitute the first H bridge circuit (Ch1) and the second H bridge circuit (Ch2) are disposed and the P-type semiconductor substrate 210 can be suppressed to an allowable value or less, and it is possible to prevent structural breakdown caused by the parasitic transistor turning on.

Also, the drive control circuit 203 includes a P-channel MOS transistor that is disposed in the fifth impurity region 215 in the semiconductor substrate 210 or is disposed directly in the semiconductor substrate 210 and includes the fifth impurity region 215. In FIG. 7, if the fifth impurity region 215 is disposed the closest to the layout region 210a or 210b in the layout region 210c, the distance between the fifth impurity region 215 and the first impurity region 211 to the fourth impurity region 214 is denoted as "E".

Similarly, the switching regulator control circuit 204 includes a p-channel MOS transistor (may be a P-channel EDMOS transistor) that is disposed in the sixth impurity region 216 in the semiconductor substrate 210 or is disposed directly in the semiconductor substrate 210 and includes the sixth impurity region 216. In FIG. 7, if the sixth impurity region 216 is disposed the closest to the layout region 210a or 210b in the layout region 210d, the distance between the sixth impurity region 216 and the first impurity region 211 to the fourth impurity region 214 is denoted by "F".

In the present embodiment, the distance E between the fifth impurity region 215 and the first impurity region 211 to the fourth impurity region 214 is greater than or equal to the distance C between the second impurity region 212 and the fourth impurity region 214, and the distance F between the sixth impurity region 216 and the first impurity region 211 to the fourth impurity region 214 is greater than or equal to the distance C between the second impurity region 212 and the fourth impurity region 214.

Accordingly, even if the multiple transistors constituting the first H bridge circuit (Ch1) or the second H bridge circuit (Ch2) perform a switching operation and generate noise, the influence of the noise on the drive control circuit 203 and the switching regulator control circuit 204 is reduced.

Accordingly, it is possible to provide a motor drive circuit 202a or 202b in which an increase in the circuit area is suppressed while preventing structural breakdown that is caused by a parasitic bipolar transistor turning on, the parasitic bipolar transistor being formed by multiple N-type impurity regions in which multiple transistors that form the first H bridge circuit (Ch1) or the second H bridge circuit (Ch2) are disposed and the P-type semiconductor 210, and it is possible to provide the semiconductor apparatus 200 including the drive control circuit 203 and the switching regulator control circuit 204, which are not likely to be influenced by noise, even if the motor drive circuit 202a or 202b performs a switching operation.

Layout 2

Figure 8:
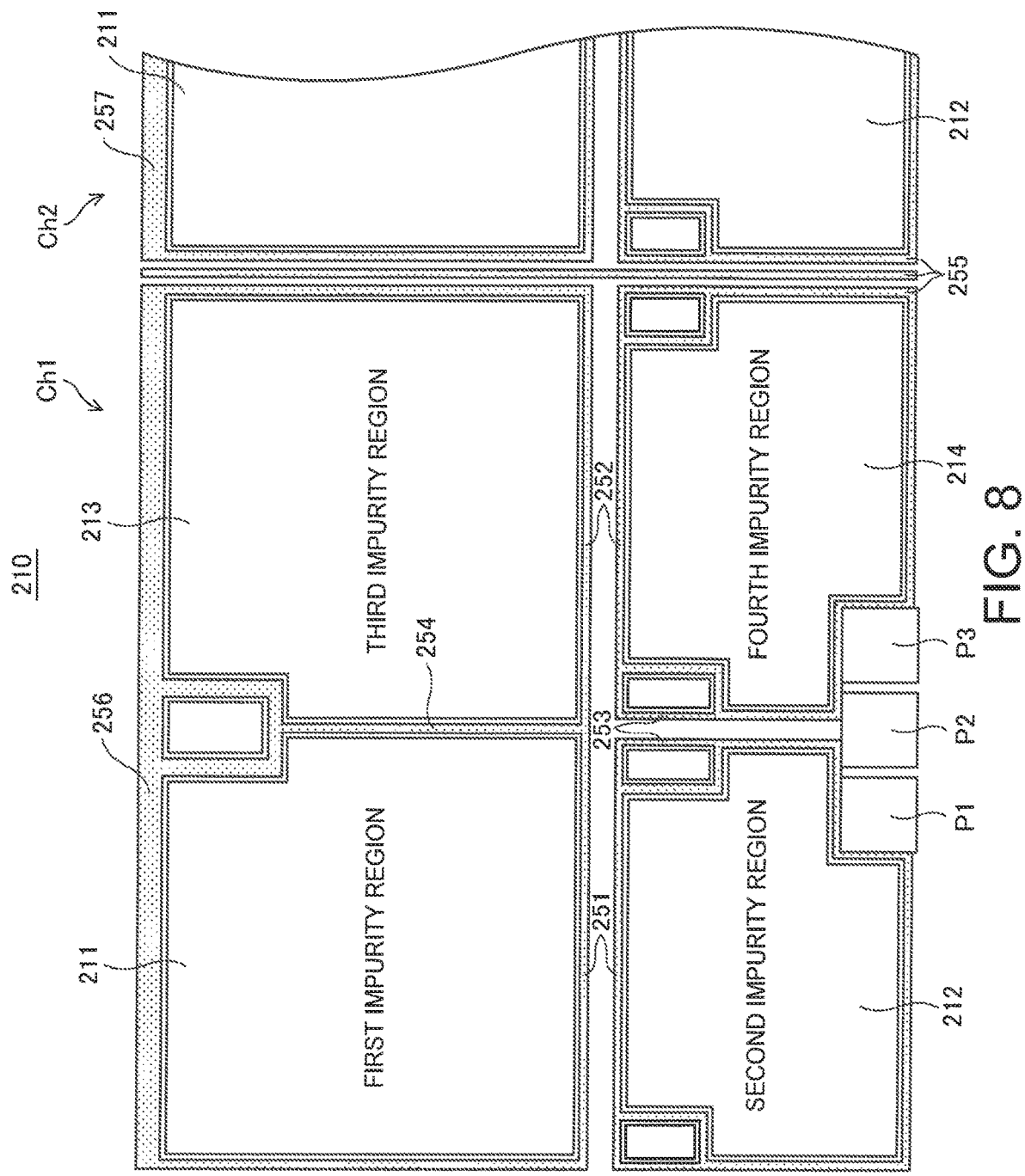
FIG. 8 is a plan view showing a second example of the layout of the semiconductor apparatus shown in FIG. 6.

FIG. 8 is a plan view showing a second example of the layout of the semiconductor apparatus shown in FIG. 6. FIG. 8 shows the first impurity region 211 to the fourth impurity region 214 of the first H bridge circuit (Ch1) and a portion of the first impurity region 211 and second impurity region 212 of the second H bridge circuit (Ch2).

In the second example, at least one guard region of the same conductivity type as the semiconductor substrate is provided between two adjacent impurity regions. For example, if a P-type semiconductor substrate 210 is used, the guard region is constituted by a P-type impurity region having a higher impurity concentration than the semiconductor substrate 210 and is electrically connected to the terminals (pads) P1 to P3 to which the second power source potential VSS is supplied. The second example may be similar to the first example shown in FIG. 7 in other respects.

As shown in FIG. 8, the layout region for disposing the elements of another circuit is provided between or around the first impurity region 211 to the fourth impurity region 214, and therefore the shapes of the impurity regions are not limited to rectangular shapes. In this kind of case, for example, the distance between the first impurity region 211 and the second impurity region 212 means the distance between the side of the first impurity region 211 and the side of the second impurity region 212 that are closest to each other.

At least one first guard region 251 that extends along the side of the first impurity region 211 near the second impurity region 212 and the side of the second impurity region 212 near the first impurity region 211 is provided between the first impurity region 211 and the second impurity region 212 in the semiconductor substrate 210.

Also, at least one second guard region 252 that extends along the side of the third impurity region 213 near the fourth impurity region 214 and the side of the fourth impurity region 214 near the third impurity region 213 is provided between the third impurity region 213 and the fourth impurity region 214.

Furthermore, at least one third guard region 253 that extends along the side of the second impurity region 212 near the fourth impurity region 214 and the side of the fourth impurity region 214 near the second impurity region 212 is provided between the second impurity region 212 and the fourth impurity region 214.

Accordingly, it is possible to prevent punchthrough from occurring due to the depletion layer widening, between the first impurity region 211 and the second impurity region 212, between the third impurity region 213 and the fourth impurity region 214, and between the second impurity region 212 and the fourth impurity region 214.

Furthermore, at least one fourth guard region 254 that extends along the side of the first impurity region 211 near the third impurity region 213 and the side of the third impurity region 213 near the first impurity region 211 may be provided between the first impurity region 211 and the third impurity region 213 in the semiconductor substrate 210.

Also, if multiple first guard regions 251, multiple second guard regions 252, and multiple third guard regions 253 are provided in the semiconductor substrate 210, the number of fourth guard regions 254 may be less than the number of first guard regions 251, less than the number of second guard regions 252, and less than the number of third guard regions 253. For example, in FIG. 8, one fourth guard region 254, two first guard regions 251, two second guard regions 252, and two third guard regions 253 are provided.

Accordingly, it is possible to suppress an increase in the circuit area by making the number of fourth guard regions 254 provided between the first impurity region 211 and the third impurity region 213, in which punchthrough is not likely to occur during a circuit operation, less than the respective numbers of the first guard regions 251 to the third guard regions 253.

Alternatively, multiple fifth guard regions 255 that extend between the first H bridge circuit (Ch1) and the second H bridge circuit (Ch2) may be provided in the semiconductor substrate 210. In this case, the number of fifth guard regions 255 may be greater than or equal to the number of first guard regions 251, greater than or equal to the number of second guard regions 252, and greater than or equal to the third guard regions 253.

For example, in FIG. 8, three fifth guard regions 255, two first guard regions 251, two second guard regions 252, and two third guard regions 253 are provided. Accordingly, punchthrough between the first H bridge circuit (Ch1) and the second H bridge circuit (Ch2) can be effectively prevented.

Furthermore, a sixth guard region 256 or a seventh region 257 may be provided between the layout region 210a or 210b shown in FIG. 7, in which the first H bridge circuit (Ch1) or the second H bridge circuit (Ch2) is disposed, and the layout region 210c in which the drive control circuit 203 is disposed or the layout region 210d in which the switching regulator control circuit 204 is disposed.

Layout 3

Figure 9:
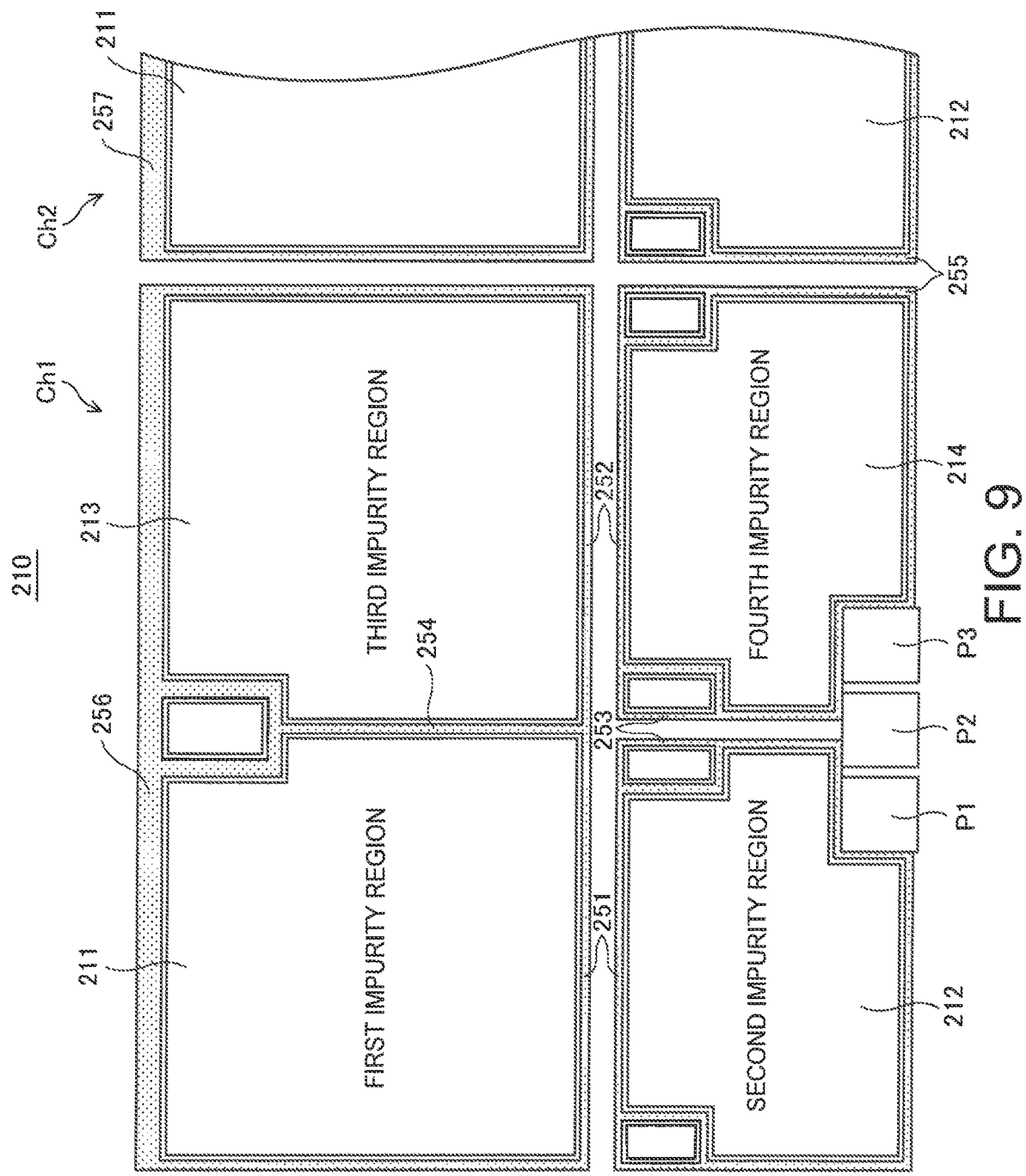
FIG. 9 is a plan view showing a third example of the layout of the semiconductor apparatus shown in FIG. 6.

FIG. 9 is a plan view showing a third example of the layout of the semiconductor apparatus shown in FIG. 6. In the third example, two fifth guard regions 255 that extend between the first H bridge circuit (Ch1) and the second H bridge circuit (Ch2) are provided in the semiconductor substrate 210. The third example may be similar to the second example shown in FIG. 8 in other respects.

According to the third example, the distance C (see FIG. 7) between the second impurity region 212 and the fourth impurity region 214 in the first H bridge circuit (Ch1) and the second H bridge circuit (Ch2), and the distance (see FIG. 7) between the first impurity region 211 to the fourth impurity region 214 of the first H bridge circuit (Ch1) and the first impurity region 211 to the fourth impurity region 214 of the second H bridge circuit (Ch2) can be made equal.

Layout 4

Figure 10:
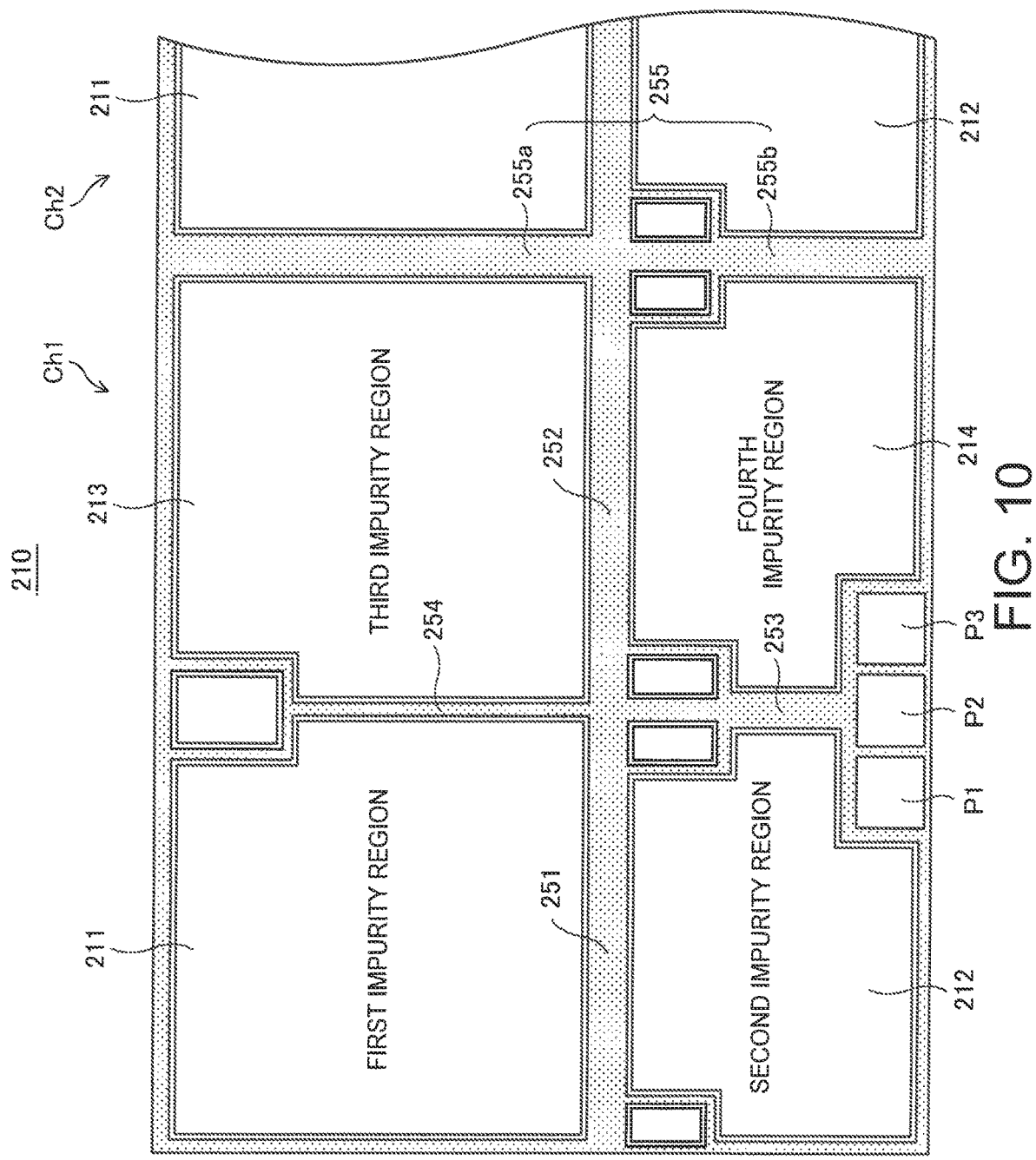
FIG. 10 is a plan view showing a fourth example of the layout of the semiconductor apparatus shown in FIG. 6.

FIG. 10 is a plan view showing a fourth example of the layout of the semiconductor apparatus shown in FIG. 6. In the fourth example, the shape and number of the guard regions are different from those in the second example. The fourth example may be similar to the second example shown in FIG. 8 in other respects.

As shown in FIG. 10, the semiconductor substrate 210 is provided with a first guard region 251 that extends between the first impurity region 211 and the second impurity region 212, a second guard region 252 that extends between the third impurity region 213 and the fourth impurity region 214, and a third guard region 253 that extends between the second impurity region 212 and the fourth impurity region 214.

Furthermore, the fourth guard region 254 that extends between the first impurity region 211 and the third impurity region 213 may be provided in the semiconductor substrate 210. In this case, the width of the fourth guard region 254 may be smaller than the width of the first guard region 251, smaller than the width of the second guard region 252, and smaller than the width of the third guard region 253.

Accordingly, it is possible to suppress an increase in the circuit area by making the width of the fourth guard region 254 provided between the first impurity region 211 and the third impurity region 213, in which punchthrough is not likely to occur during a circuit operation, less than the respective widths of the first guard region 251 to the third guard region 253.

Alternatively, the fifth guard region 255 that extends between the first H bridge circuit (Ch1) and the second H bridge circuit (Ch2) may be provided in the semiconductor substrate 210. In this case, the width of the fifth guard region 255 may be greater than or equal to the width of the first guard region 251, greater than or equal to the width of the second guard region 252, and greater than or equal to the width of the third guard region 253. Accordingly, punchthrough between the first H bridge circuit (Ch1) and the second H bridge circuit (Ch2) can be effectively prevented.

The fifth guard region 255 includes a first portion 255a that is located between the third impurity region 213 of the first H bridge circuit (Ch1) and the first impurity region 211 of the second H bridge circuit (Ch2) and a second portion 255b that is located between the fourth impurity region 214 of the first H bridge circuit (CM) and the second impurity region 212 of the second H bridge circuit (Ch2).

In FIG. 10, the width of the first portion 255a and the width of the second portion 255b of the fifth guard region are made identical in order to simplify the layout. However, the width of the first portion 255a of the fifth guard region need only be greater than or equal to the width of the fourth guard region 254, and may be smaller than the width of the second portion 255b of the fifth guard region. Also, elements of another circuit may be disposed between the first H bridge circuit (Ch1) and the second H bridge circuit (Ch2).

Third Embodiment

Figure 11:
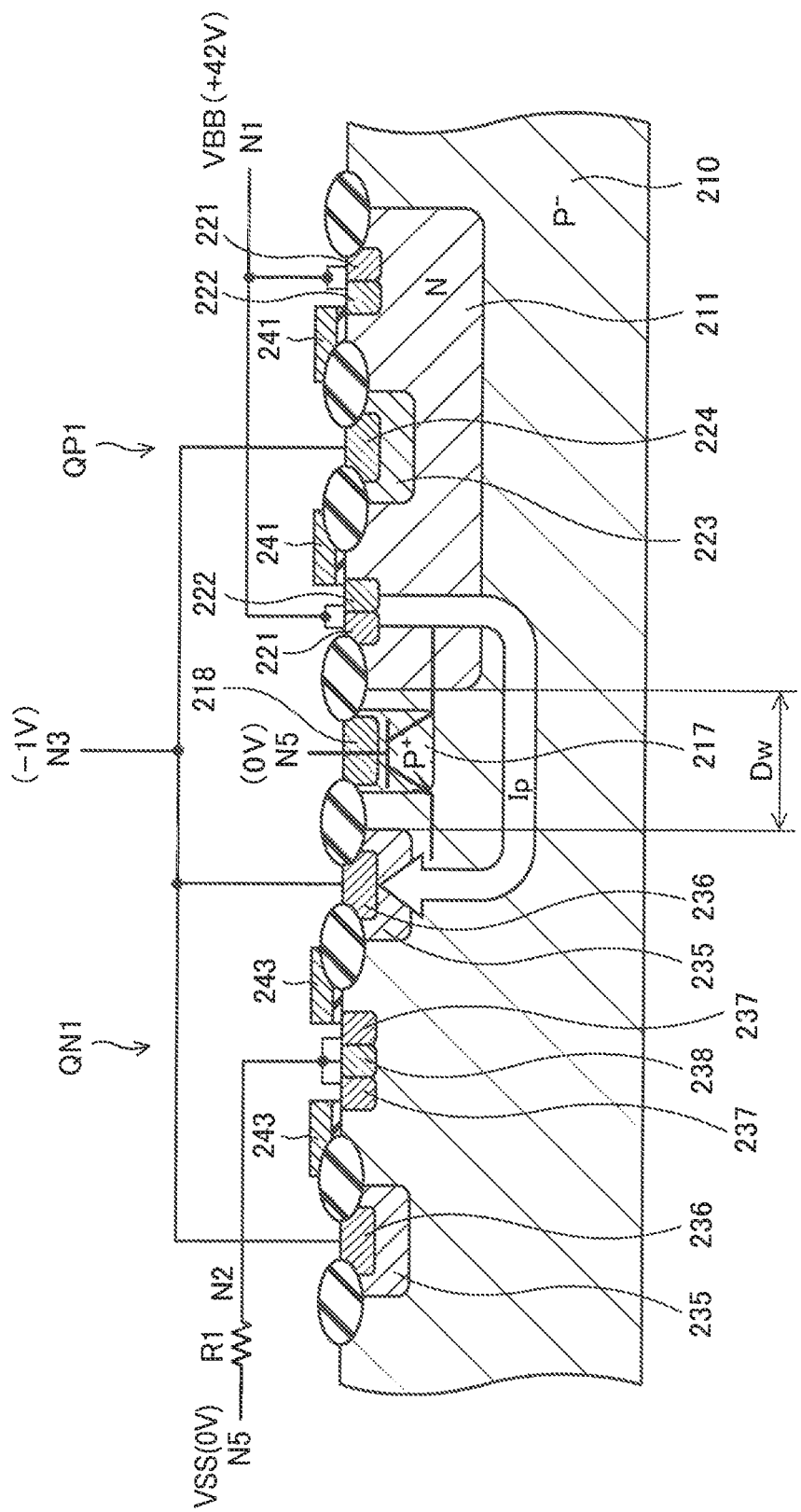
FIG. 11 is a cross-sectional view showing a specific example of a motor drive circuit of a third embodiment.

FIG. 11 is a cross-sectional diagram showing a specific example of the motor drive circuit of the third embodiment. In the third embodiment, EDMOS transistors are used as the transistors QN1 and QN2 in the H bridge circuit shown in FIG. 1. The third embodiment may be similar to the first or second embodiment in other respects.

As shown in FIG. 11, the first P-channel MOS transistor QP1 is an EDMOS transistor and is disposed in the N-type first impurity region 211 in the semiconductor substrate 210. Also, the first N-channel MOS transistor QN1 is an EDMOS transistor and includes an N-type second impurity region 235 in the semiconductor substrate 210.

Although not shown in FIG. 11, the second P-channel MOS transistor QP2 is an EDMOS transistor, and is disposed in an N-type third impurity region in the semiconductor substrate 210. Also, the second N-channel MOS transistor QN2 is an EDMOS transistor, and includes an N-type fourth impurity region in the semiconductor substrate 210. Hereinafter, a configuration of the transistors QP1 and QN1 will be described as an example, but the transistors QP2 and QN2 also have similar configurations thereto.

A second impurity region 235 that constitutes the extended drain of the transistor QN1, an N-type impurity region 236 that constitutes the drain of the transistor QN1, an N-type impurity region 237 that constitutes the source of the transistor QN1, and a P-type contact region 238 are disposed in the semiconductor substrate 210. The N-type impurity region 236 has a higher impurity concentration than the second impurity region 235.

A P-type impurity region (P+) 217 having a higher impurity concentration than the semiconductor substrate 210 is disposed between the first impurity region 211 and the second impurity region 235 in the semiconductor substrate 210 and a P-type contact region 218 is disposed in the P-type impurity region 217. The P-type impurity region 217 corresponds to a guard region for preventing the depletion layer from widening between the first impurity region 211 and the second impurity region 235 and causing punchthrough.

Also, a gate electrode 241 of the transistor QP1 and a gate electrode 243 of the transistor QN1 are disposed in the semiconductor substrate 210 via a gate insulating film. Furthermore, a wiring layer including multiple wires is disposed via an interlayer insulating film on the semiconductor substrate 210 on which the gate electrodes 241 and 243 and the like are disposed. The interlayer insulating film and the wire layer may have multilayer structures as needed.

The N-type contact region 221 and the P-type impurity region 222 are connected to the first node N1 via the wires. The P-type contact region 218 is connected to the fifth node N5 via the wires. The N-type impurity region 237 and the P-type contact region 238 are connected to the second node N2 via the wires. The P-type impurity region 224 and the N-type impurity region 236 are connected to the third node N3 via the wires. Note that the resistance value of the semiconductor substrate 210 between the P-type contact region 238 and the P-type impurity region 217 is sufficiently larger than the resistance value of the resistor R1, and therefore hardly any current flows between the P-type contact region 238 and the P-type impurity region 217.

Here, as shown in FIG. 11, a parasitic NPN bipolar transistor is formed with the N-type first impurity region 211 serving as the collector, the P-type semiconductor substrate 210 serving as the base, and the N-type second impurity region 235 serving as the emitter. The first power source potential VBB (e.g., +42 V) is supplied from the first node N1 to the first impurity region 211 via the N-type contact region 221 and the second power source potential VSS (e.g., 0 V) is supplied from the fifth node N5 to the semiconductor substrate 210 via the P-type contact region 218 and the P-type impurity region 217.

In the high-speed attenuation mode shown in FIG. 2B, when a regenerative current flows from the fifth node N5 to the first node N1 via the transistors QN1 and QP2 and the like, a negative potential (e.g., about −1 V) is applied to the third node N3. Accordingly, a negative potential is applied from the third node N3 to the second impurity region 235 via the N-type impurity region 236.

Thus, the parasitic transistor turns on and the parasitic current Ip flows from the first impurity region 211 to the second impurity region 235 via the semiconductor substrate 210. If the hFE (DC current amplification ratio) of the parasitic transistor is large, a large parasitic current Ip exceeding an allowable limit flows, causing structural breakdown of the IC in some cases.

The smaller the distance Dw between the first impurity region 211 and the second impurity region 235 is, the greater the hFE of the parasitic transistor is. Accordingly, by setting the distance Dw between the first impurity region 211 and the second impurity region 235 to be a predetermined distance or more, it is possible to suppress the hFE of the parasitic transistor to an allowable value or less, at which no structural breakdown of the IC occurs.

Alternatively, in the third embodiment, common MOS transistors may be used as the transistors QN1 and QN2. In this case, the N-type offset region is provided instead of the extended drain of the transistor QN1 shown in FIG. 11, and the N-type offset region corresponds to the second impurity region. Also, the N-type offset region is provided instead of the extended drain of the transistor QN2, and the N-type offset region corresponds to the fourth impurity region.

Fourth Embodiment

Figure 12:
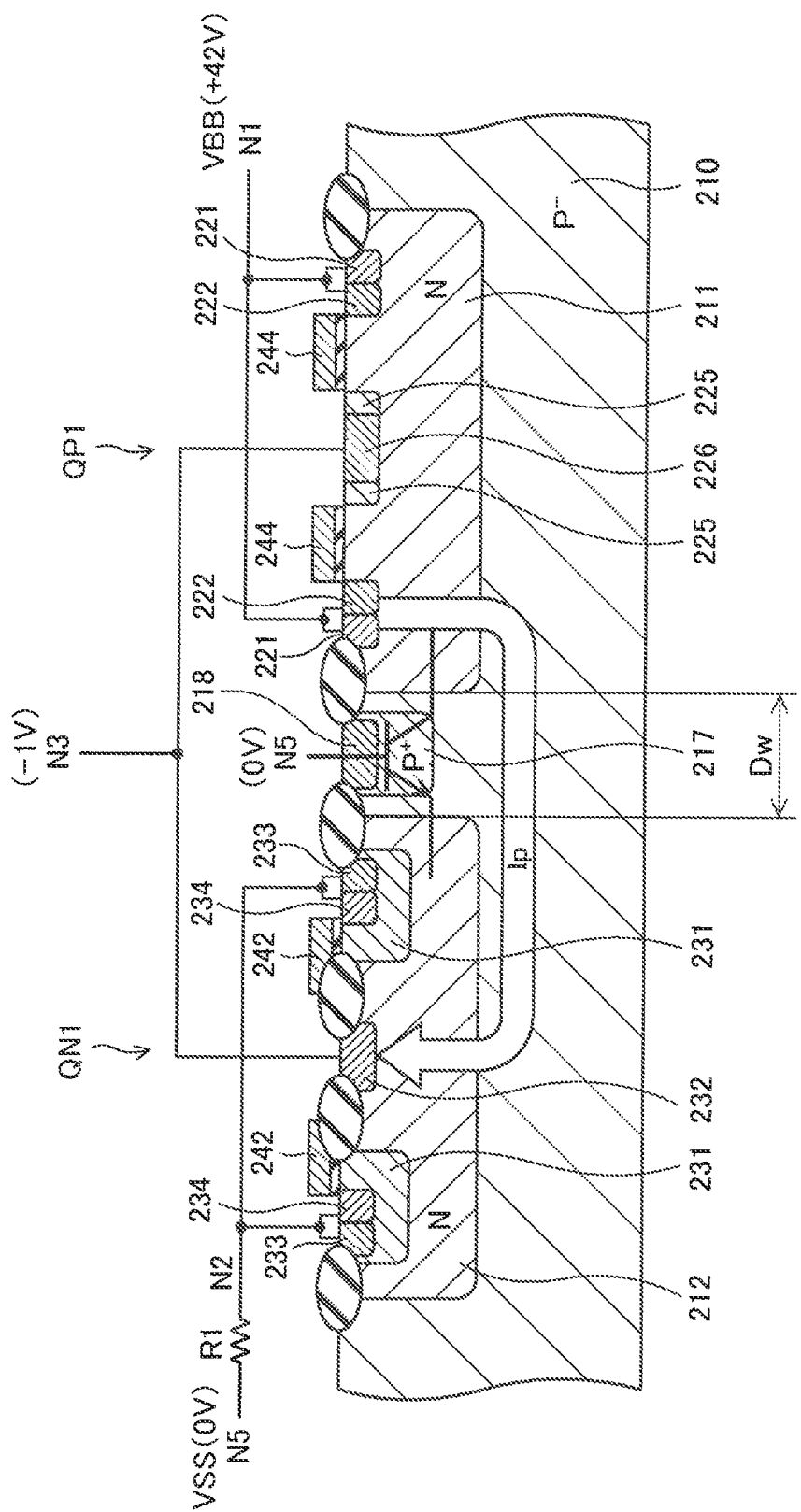
FIG. 12 is a cross-sectional view showing a specific example of a motor drive circuit of a fourth embodiment.

FIG. 12 is a cross-sectional diagram showing a specific example of the motor drive circuit of the fourth embodiment. In the fourth embodiment, common MOS transistors are used as the transistors QP1 and QP2 in the H bridge circuit shown in FIG. 1. The fourth embodiment may be similar to any of the first to third embodiments in other respects.

As shown in FIG. 12, the first P-channel MOS transistor QP1 is a common MOS transistor, and is disposed in the N-type first impurity region 211 in the semiconductor substrate 210. Also, the first N-channel MOS transistor QN1 is an LDMOS transistor, and is disposed in an N-type second impurity region 212 in the semiconductor substrate 210.

Although not shown in FIG. 12, the second P-channel MOS transistor QP2 is a common MOS transistor, and is disposed in an N-type third impurity region in the semiconductor substrate 210. Also, the second N-channel MOS transistor QN2 is an LDMOS transistor, and is disposed in an N-type fourth impurity region in the semiconductor substrate 210. Hereinafter, a configuration of the transistors QP1 and QN1 will be described as an example, but the transistors QP2 and QN2 also have similar configurations thereto.

An N-type contact region 221, a P-type impurity region 222 constituting the source of the transistor QP1, a P-type offset region 225, and a P-type impurity region 226 are disposed in the first impurity region 211. The P-type impurity region 226 has a higher impurity concentration than the P-type offset region 225 and constitutes the drain of the transistor QP1 together with the P-type offset region 225.

A P-type impurity region (P+) 217 having a higher impurity concentration than the semiconductor substrate 210 is disposed between the first impurity region 211 and the second impurity region 212 in the semiconductor substrate 210 and a P-type contact region 218 is disposed in the P-type impurity region 217. The P-type impurity region 217 corresponds to a guard region for preventing the depletion layer from widening between the first impurity region 211 and the second impurity region 212 and causing punchthrough.

Also, a gate electrode 244 of the transistor QP1 and a gate electrode 242 of the transistor QN1 are disposed on the semiconductor substrate 210 via a gate insulating film. Furthermore, a wiring layer including multiple wires is disposed via an interlayer insulating film on the semiconductor substrate 210 on which the gate electrodes 244 and 242 and the like are disposed. The interlayer insulating film and the wiring layer may have multilayer structures as needed.

The N-type contact region 221 and the P-type impurity region 222 are connected to the first node N1 via the wiring. The P-type contact region 218 is connected to the fifth node N5 via the wiring. The P-type contact region 233 and the N-type impurity region 234 are connected to the second node N2 via the wiring. The P-type impurity region 226 and the N-type impurity region 232 are connected to the third node N3 via the wiring.

Here, as shown in FIG. 12, a parasitic NPN bipolar transistor is formed with the N-type first impurity region 211 serving as the collector, the P-type semiconductor substrate 210 serving as the base, and the N-type second impurity region 212 serving as the emitter. The first power source potential VBB (e.g., +42 V) is supplied from the first node N1 to the first impurity region 211 via the N-type contact region 221 and the second power source potential VSS (e.g., 0 V) is supplied from the fifth node N5 to the semiconductor substrate 210 via the P-type contact region 218 and the P-type impurity region 217.

In the high-speed attenuation mode shown in FIG. 2B, when a regenerative current flows from the fifth node N5 to the first node N1 via the transistors QN1 and QP2 and the like, a negative potential (e.g., about −1 V) is applied to the third node N3. Accordingly, a negative potential is applied from the third node N3 to the second impurity region 212 via the N-type impurity region 232.

Thus, the parasitic transistor turns on and the parasitic current Ip flows from the first impurity region 211 to the second impurity region 212 via the semiconductor substrate 210. If the hFE (DC current amplification ratio) of the parasitic transistor is large, a large parasitic current Ip exceeding an allowable limit flows, causing structural breakdown of the IC in some cases.

The smaller the distance Dw between the first impurity region 211 and the second impurity region 212 is, the greater the hFE of the parasitic transistor is. Accordingly, by setting the distance Dw between the first impurity region 211 and the second impurity region 212 to be a predetermined distance or more, it is possible to suppress the hFE of the parasitic transistor to an allowable value or less, at which no structural breakdown of the IC occurs.

Fifth Embodiment

Figure 13:
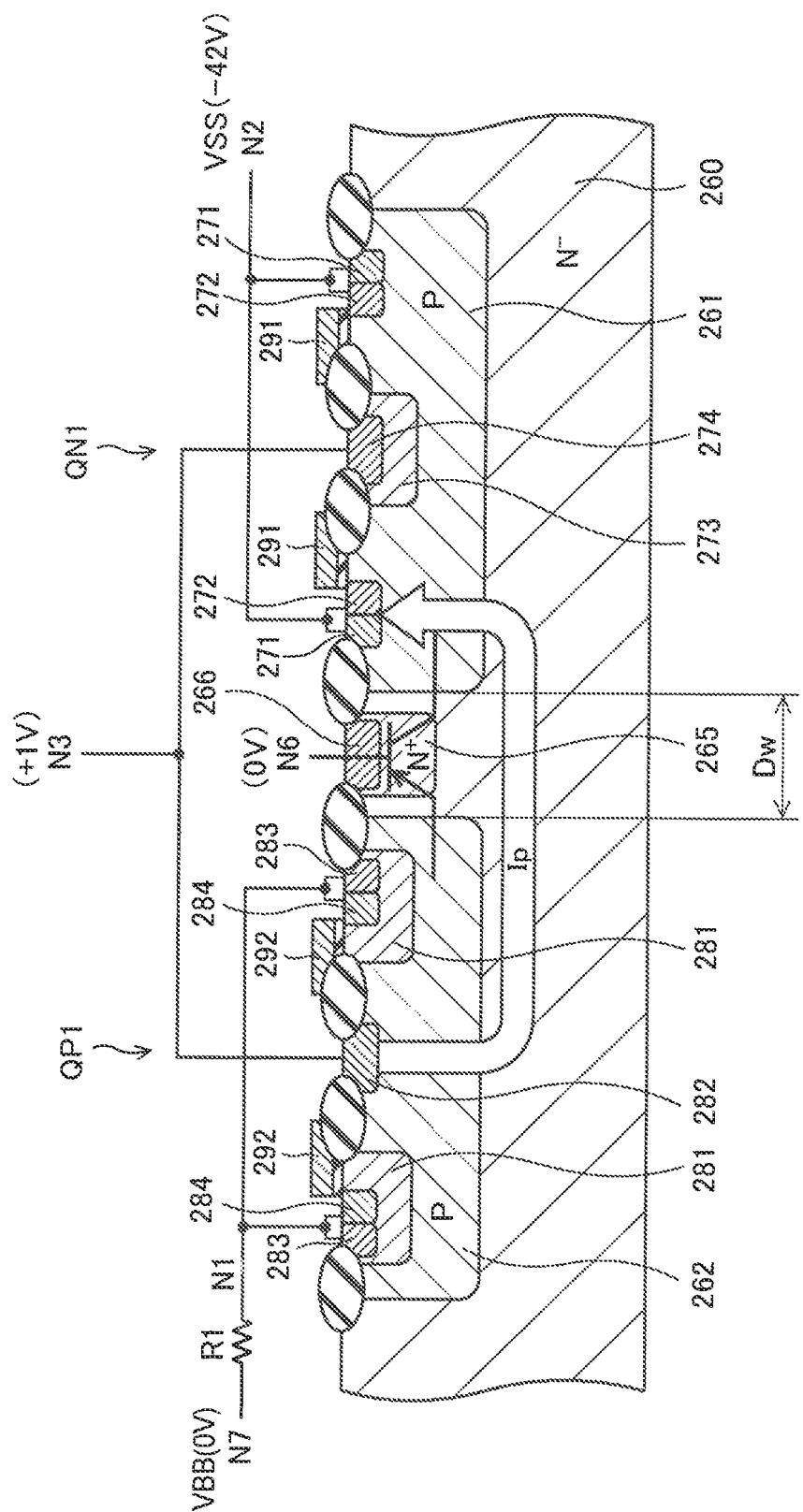
FIG. 13 is a cross-sectional view showing a specific example of a motor drive circuit of a fifth embodiment.

FIG. 13 is a cross-sectional diagram showing a specific example of the motor drive circuit of the fifth embodiment. In the fifth embodiment, the N-type semiconductor substrate (e.g., a silicon substrate including an N-type impurity such as phosphorous or arsenic) 260 is used instead of the P-type semiconductor substrate 210 shown in FIG. 3. Accompanying this, the P-type region and the N-type region in the semiconductor substrate are reversed, the P-channel transistor and the N-channel transistor are reversed, and the connection relationship between the circuits is changed accordingly. The fifth embodiment may be similar to any of the first to fourth embodiments in other respects.

The motor drive circuit of the fifth embodiment includes an H bridge circuit that is connected to a first node N1 to which the first power source potential VBB (e.g., 0 V) is supplied, a second node N2 to which the second power source potential VSS (e.g., −42 V) that is lower than the first power source potential VBB is supplied, and a third node N3 and a fourth node N4 (see FIG. 1), which are respectively connected to the two terminals of the motor 100 that is to be driven.

The first power source potential VBB is supplied to a seventh node N7 as well. As shown in FIG. 13, if the resistor R1 is connected between the seventh node N7 and the first node N1, the first power source potential VBB is supplied to the first node N1 via the resistor R1.

The H bridge circuit of the fifth embodiment is obtained by replacing the P-channel EDMOS transistor with a P-channel LDMOS transistor and replacing the N-channel LDMOS transistor with an N-channel EDMOS transistor in the H bridge circuit shown in FIG. 1.

Accordingly, the first N-channel MOS transistor QN1 is an EDMOS transistor, and is disposed in a P-type first impurity region 261 in the semiconductor substrate 260. Also, the first P-channel MOS transistor QP1 is an LDMOS transistor, and is disposed in a P-type second impurity region 262 in the semiconductor substrate 260.

Although not shown in FIG. 13, the second N-channel MOS transistor QN2 is an EDMOS transistor, and is disposed in a P-type third impurity region in the semiconductor substrate 260. Also, the second P-channel MOS transistor QP2 is an LDMOS transistor, and is disposed in a P-type fourth impurity region in the semiconductor substrate 260. Hereinafter, a configuration of the transistors QN1 and QP1 will be described as an example, but the transistors QN2 and QP2 also have similar configurations.

A P-type contact region 271, an N-type impurity region 272 constituting the source of the transistor QN1, an N-type impurity region 273 constituting the extended drain of the transistor QN1, and an N-type impurity region 274 constituting the drain of the transistor QN1 are disposed in the first impurity region 261. The N-type impurity region 274 has a higher impurity concentration than the N-type impurity region 273.

An N-type body region 281 and a P-type impurity region 282 constituting the drain of the transistor QP1 are disposed in the second impurity region 262. An N-type contact region 283 and a P-type impurity region 284 that constitutes the source of the transistor QP1 are disposed in the N-type body region 281.

An N-type impurity region (N+) 265 having a higher impurity concentration than the semiconductor substrate 260 is disposed between the first impurity region 261 and the second impurity region 262 in the semiconductor substrate 260, and an N-type contact region 266 is disposed in the N-type impurity region 265. The N-type impurity region 265 corresponds to a guard region for preventing the depletion layer from widening between the first impurity region 261 and the second impurity region 262 and causing punch-through.

Also, a gate electrode 291 of the transistor QN1 and a gate electrode 292 of the transistor QP1 are disposed on the semiconductor substrate 260 via a gate insulating film. Furthermore, a wiring layer including multiple wires is disposed via an interlayer insulating film on the semiconductor substrate 260 on which the gate electrodes 291 and 292 are disposed.

The N-type contact region 283 and the P-type impurity region 284 are connected to the first node N1 via the wiring. The N-type contact region 266 is connected to the seventh node N7 via the wiring. The P-type contact region 271 and the N-type impurity region 272 are connected to the second node N2 via the wiring. The P-type impurity region 282 and the N-type impurity region 274 are connected to the third node N3 via the wiring.

Here, as shown in FIG. 13, a parasitic PNP bipolar transistor is formed with the P-type second impurity region 262 serving as the emitter, the N-type semiconductor substrate 260 serving as the base, and the P-type first impurity region 261 serving as the collector. The second power source potential VSS (e.g., −42 V) is supplied from the second node N2 to the first impurity region 261 via the P-type contact region 271, and the first power source potential VBB (e.g., 0 V) is supplied from the seventh node N7 to the semiconductor substrate 260 via the N-type contact region 266 and the N-type impurity region 265.

In the high-speed attenuation mode, if a regenerative current flows from the second node N2 to the seventh node N7 via the transistors QN2 and QP1 and the like, a positive potential (e.g., about +1 V) is applied to the third node N3. Accordingly, a positive potential is supplied from the third node N3 to the second impurity region 262 via the P-type impurity region 282.

Thus, the parasitic transistor turns on and the parasitic current Ip flows from the second impurity region 262 to the first impurity region 261 via the semiconductor substrate 260. If the hFE (DC current amplification ratio) of the parasitic transistor is large, a large parasitic current Ip exceeding an allowable limit flows, causing structural breakdown of the IC in some cases.

In view of this, the first to fourth embodiments are applied also to the fifth embodiment by reversing the P-type region and the N-type region in the semiconductor substrate in FIGS. 4 to 12 and the description thereof. That is, the P-type first impurity region to sixth impurity region are provided instead of the N-type first impurity region 211 to sixth impurity region 216 shown in FIGS. 5 and 7 to 10.

For example, the distance A between the first impurity region and the third impurity region is set to be smaller than the distance B1 between the first impurity region and the second impurity region, smaller than the distance B2 between the third impurity region and the fourth impurity region, and smaller than the distance C between the second impurity region and the fourth impurity region.

Accordingly, in a motor drive circuit, the hFE of a parasitic PNP bipolar transistor formed by multiple P-type impurity regions in which multiple transistors that constitute an H bridge circuit are disposed and the N-type semiconductor substrate 260 can be suppressed to an allowable value or less to prevent structural breakdown caused by a parasitic transistor turning on, and it is possible to suppress an increase in circuit area and suppress cost by reducing the distance between the first impurity region and the third impurity region, in which a parasitic transistor is not likely to turn on during a circuit operation.

Also, if the N-type semiconductor substrate 260 is used, the guard regions are constituted by N-type impurity regions having a higher impurity concentration than the semiconductor substrate 260 and are electrically connected to terminals (pads) to which the first power source potential VBB is supplied. Accordingly, the N-type first guard region to seventh guard region are provided instead of the P-type first guard region 251 to seventh guard region 257 shown in FIGS. 8 to 10.

Furthermore, according to the first to fifth embodiments of the invention, a compact electronic device with high reliability can be provided using a motor drive circuit in which an increase in the circuit area is suppressed while preventing structural breakdown caused by a parasitic bipolar transistor turning on, the parasitic bipolar transistor being formed by multiple impurity regions of the same conductivity type in which multiple transistors that constitute an H bridge circuit are disposed or formed, and a semiconductor substrate of the opposite conductivity type.

The invention is not limited to the above-described embodiments, and many modifications are possible within the technical idea of the invention by a person having regular knowledge in the relevant technical field. For example, it is also possible to carry out multiple embodiments selected from the above-described embodiments in combination.

What is claimed is:

1. A motor drive circuit including a first H bridge circuit that is connected to a first node to which a first power source potential is supplied, to a second node to which a second power source potential that is lower than the first power source potential is supplied, and to a third node and fourth node that are respectively connected to two terminals of a motor to be driven,
    wherein the first H bridge circuit includes:
    a first P-channel MOS transistor that is disposed in an N-type first impurity region in a P-type semiconductor substrate and is connected between the first node and the third node;
    a first N-channel MOS transistor that is disposed in an N-type second impurity region in the semiconductor substrate or is disposed directly in the semiconductor substrate having an N-type second impurity region, and that is connected between the second node and the third node;
    a second P-channel MOS transistor that is disposed in an N-type third impurity region in the semiconductor substrate and is connected between the first node and the fourth node; and
    a second N-channel MOS transistor that is disposed in an N-type fourth impurity region in the semiconductor substrate or is disposed directly in the semiconductor substrate and includes an N-type fourth impurity region, and that is connected between the second node and the fourth node, and
    a distance between the N-type first impurity region and the N-type third impurity region is smaller than a distance between the N-type first impurity region and the N-type second impurity region, smaller than a distance between the N-type third impurity region and the N-type fourth impurity region, and smaller than a distance between the N-type second impurity region and the N-type fourth impurity region.

2. The motor drive circuit according to claim 1, wherein the first P-channel MOS transistor is an EDMOS transistor,
    the second P-channel MOS transistor is an EDMOS transistor,
    the first N-channel MOS transistor is an LDMOS transistor, and
    the second N-channel MOS transistor is an LDMOS transistor.

3. A semiconductor apparatus comprising:
    the motor drive circuit according to claim 2;
    a drive control circuit including a transistor that is disposed in a fifth impurity region in the semiconductor substrate, or is disposed directly in the semiconductor substrate having a fifth impurity region; and
    a switching regulator control circuit including a transistor that is disposed in a sixth impurity region in the semiconductor substrate, or is disposed directly in the semiconductor substrate having a sixth impurity region,
    wherein a distance between the fifth impurity region and the N-type first to fourth impurity regions is greater than or equal to the distance between the N-type second impurity region and the N-type fourth impurity region, and a distance between the sixth impurity region and the N-type first to fourth impurity regions is greater than or equal to the distance between the N-type second impurity region and the N-type fourth impurity region.

4. The motor drive circuit according to claim 1, wherein the distance between the N-type first impurity region and the N-type second impurity region, the distance between the N-type third impurity region and the N-type fourth impurity region, and the distance between the N-type second impurity region and the N-type fourth impurity region are equal to each other.

5. A semiconductor apparatus comprising:
    the motor drive circuit according to claim 4;
    a drive control circuit including a transistor that is disposed in a fifth impurity region in the semiconductor substrate, or is disposed directly in the semiconductor substrate having a fifth impurity region; and
    a switching regulator control circuit including a transistor that is disposed in a sixth impurity region in the semiconductor substrate, or is disposed directly in the semiconductor substrate having a sixth impurity region,
    wherein a distance between the fifth impurity region and the N-type first to fourth impurity regions is greater than or equal to the distance between the N-type second impurity region and the N-type fourth impurity region, and a distance between the sixth impurity region and the N-type first to fourth impurity regions is greater than or equal to the distance between the N-type second impurity region and the N-type fourth impurity region.

6. The motor drive circuit according to claim 1, further comprising:
    at least one first guard region that has the same conductivity type as the semiconductor substrate and extends between the N-type first impurity region and the N-type second impurity region in the semiconductor substrate, along a side of the N-type first impurity region adjacent to the N-type second impurity region and a side of the N-type second impurity region adjacent to the N-type first impurity region;
    at least one second guard region that has the same conductivity type as the semiconductor substrate and extends between the N-type third impurity region and the N-type fourth impurity region in the semiconductor substrate, along a side of the N-type third impurity region adjacent to the N-type fourth impurity region and a side of the N-type fourth impurity region adjacent to the N-type third impurity region; and at least one third guard region that has the same conductivity type as the semiconductor substrate and extends between the N-type second impurity region and the N-type fourth impurity region in the semiconductor substrate, along a side of the N-type second impurity region adjacent to the N-type fourth impurity region and a side of the N-type fourth impurity region adjacent to the N-type second impurity region.

7. The motor drive circuit according to claim 6, comprising:
a plurality of the first guard regions; a plurality of the second guard regions; and a plurality of the third guard regions,
and further comprising
at least one fourth guard region that has the same conductivity type as the semiconductor substrate and extends between the N-type first impurity region and the N-type third impurity region in the semiconductor substrate, along a side of the N-type first impurity region adjacent to the N-type third impurity region and a side of the N-type third impurity region adjacent to the N-type first impurity region,
wherein the number of the fourth guard regions is smaller than the number of the first guard regions, smaller than the number of the second guard regions, and smaller than the number of the third guard regions.

8. A semiconductor apparatus comprising:
the motor drive circuit according to claim 7;
a drive control circuit including a transistor that is disposed in a fifth impurity region in the semiconductor substrate, or is disposed directly in the semiconductor substrate having a fifth impurity region; and
a switching regulator control circuit including a transistor that is disposed in a sixth impurity region in the semiconductor substrate, or is disposed directly in the semiconductor substrate having a sixth impurity region,
wherein a distance between the fifth impurity region and the N-type first to fourth impurity regions is greater than or equal to the distance between the N-type second impurity region and the N-type fourth impurity region, and a distance between the sixth impurity region and the N-type first to fourth impurity regions is greater than or equal to the distance between the N-type second impurity region and the N-type fourth impurity region.

9. The motor drive circuit according to claim 6, further comprising
a fourth guard region that has the same conductivity type as the semiconductor substrate and extends between the N-type first impurity region and the N-type third impurity region in the semiconductor substrate, along a side of the N-type first impurity region adjacent to the N-type third impurity region and a side of the N-type third impurity region adjacent to the N-type first impurity region,
wherein the width of the fourth guard region is smaller than the width of the first guard region, smaller than the width of the second guard region, and smaller than the width of the third guard region.

10. A semiconductor apparatus comprising:
the motor drive circuit according to claim 9;
a drive control circuit including a transistor that is disposed in a fifth impurity region in the semiconductor substrate, or is disposed directly in the semiconductor substrate having a fifth impurity region; and
a switching regulator control circuit including a transistor that is disposed in a sixth impurity region in the semiconductor substrate, or is disposed directly in the semiconductor substrate having a sixth impurity region,
wherein a distance between the fifth impurity region and the N-type first to fourth impurity regions is greater than or equal to the distance between the N-type second impurity region and the N-type fourth impurity region, and a distance between the sixth impurity region and the N-type first to fourth impurity regions is greater than or equal to the distance between the N-type second impurity region and the N-type fourth impurity region.

11. The motor drive circuit according to claim 6, further comprising:
a second H bridge circuit having the same configuration as the first H bridge circuit; and
a plurality of fifth guard regions that have the same conductivity type as the semiconductor substrate and extend between the first H bridge circuit and the second H bridge circuit in the semiconductor substrate,
wherein the number of the fifth guard regions is greater than or equal to the number of the first guard regions, greater than or equal to the number of the second guard regions, and greater than or equal to the number of the third guard regions.

12. A semiconductor apparatus comprising:
the motor drive circuit according to claim 11;
a drive control circuit including a transistor that is disposed in a fifth impurity region in the semiconductor substrate, or is disposed directly in the semiconductor substrate having a fifth impurity region; and
a switching regulator control circuit including a transistor that is disposed in a sixth impurity region in the semiconductor substrate, or is disposed directly in the semiconductor substrate having a sixth impurity region,
wherein a distance between the fifth impurity region and the N-type first to fourth impurity regions is greater than or equal to the distance between the N-type second impurity region and the N-type fourth impurity region, and a distance between the sixth impurity region and the N-type first to fourth impurity regions is greater than or equal to the distance between the N-type second impurity region and the N-type fourth impurity region.

13. The motor drive circuit according to claim 6, further comprising:
a second H bridge circuit having the same configuration as the first H bridge circuit; and
a fifth guard region that has the same conductivity type as the semiconductor substrate and extends between the first H bridge circuit and the second H bridge circuit in the semiconductor substrate,
wherein the width of the fifth guard region is greater than or equal to the width of the first guard region, greater than or equal to the width of the second guard region, and greater than or equal to the width of the third guard region.

14. A semiconductor apparatus comprising:
the motor drive circuit according to claim 6;
a drive control circuit including a transistor that is disposed in a fifth impurity region in the semiconductor substrate, or is disposed directly in the semiconductor substrate having a fifth impurity region; and
a switching regulator control circuit including a transistor that is disposed in a sixth impurity region in the semiconductor substrate, or is disposed directly in the semiconductor substrate having a sixth impurity region,
wherein a distance between the fifth impurity region and the N-type first to fourth impurity regions is greater than or equal to the distance between the N-type second impurity region and the N-type fourth impurity region, and a distance between the sixth impurity region and the N-type first to fourth impurity regions is greater than or equal to the distance between the N-type second impurity region and the N-type fourth impurity region.

15. The motor drive circuit according to claim 1, further comprising
a second H bridge circuit having the same configuration as the first H bridge circuit,
wherein the distance between the first to N-type fourth impurity regions of the first H bridge circuit and the first to N-type fourth impurity regions of the second H bridge circuit is greater than or equal to the distance between the N-type second impurity region and the N-type fourth impurity region of the first or second H bridge circuit.

16. A semiconductor apparatus comprising:
the motor drive circuit according to claim 15;
a drive control circuit including a transistor that is disposed in a fifth impurity region in the semiconductor substrate, or is disposed directly in the semiconductor substrate having a fifth impurity region; and
a switching regulator control circuit including a transistor that is disposed in a sixth impurity region in the semiconductor substrate, or is disposed directly in the semiconductor substrate having a sixth impurity region,
wherein a distance between the fifth impurity region and the N-type first to fourth impurity regions is greater than or equal to the distance between the N-type second impurity region and the N-type fourth impurity region, and a distance between the sixth impurity region and the N-type first to fourth impurity regions is greater than or equal to the distance between the N-type second impurity region and the N-type fourth impurity region.

17. A semiconductor apparatus comprising:
the motor drive circuit according to claim 1;
a drive control circuit including a transistor that is disposed in a fifth impurity region in the semiconductor substrate, or is disposed directly in the semiconductor substrate having a fifth impurity region; and
a switching regulator control circuit including a transistor that is disposed in a sixth impurity region in the semiconductor substrate, or is disposed directly in the semiconductor substrate having a sixth impurity region,
wherein a distance between the fifth impurity region and the N-type first to fourth impurity regions is greater than or equal to the distance between the N-type second impurity region and the N-type fourth impurity region, and a distance between the sixth impurity region and the N-type first to fourth impurity regions is greater than or equal to the distance between the N-type second impurity region and the N-type fourth impurity region.

18. An electronic device comprising:
the motor drive circuit according to claim 1; and
the motor including the two terminals that are respectively connected to the third node and the fourth node.

19. A motor drive circuit including a first H bridge circuit that is connected to a first node to which a first power source potential is supplied, a second node to which a second power source potential that is lower than the first power source potential is supplied, and a third node and fourth node that are respectively connected to two terminals of a motor to be driven,
wherein the first H bridge circuit includes:
a first N-channel EDMOS transistor that is disposed in a P-type first impurity region in an N-type semiconductor substrate and is connected between the second node and the third node;
a first P-channel LDMOS transistor that is disposed in a P-type second impurity region in the semiconductor substrate and is connected between the first node and the third node;
a second N-channel EDMOS transistor that is disposed in a P-type third impurity region in the semiconductor substrate and is connected between the second node and the fourth node; and
a second P-channel LDMOS transistor that is disposed in a P-type fourth impurity region in the semiconductor substrate and is connected between the first node and the fourth node, and
a distance between the P-type first impurity region and the P-type third impurity region is smaller than a distance between the P-type first impurity region and the P-type second impurity region, smaller than a distance between the P-type third impurity region and the P-type fourth impurity region, and smaller than a distance between the P-type second impurity region and the P-type fourth impurity region.

20. A semiconductor apparatus comprising:
the motor drive circuit according to claim 19;
a drive control circuit including a transistor that is disposed in a fifth impurity region in the semiconductor substrate, or is disposed directly in the semiconductor substrate having a fifth impurity region; and
a switching regulator control circuit including a transistor that is disposed in a sixth impurity region in the semiconductor substrate, or is disposed directly in the semiconductor substrate having a sixth impurity region,
wherein a distance between the fifth impurity region and the P-type first to fourth impurity regions is greater than or equal to the distance between the P-type second impurity region and the P-type fourth impurity region, and a distance between the sixth impurity region and the P-type first to fourth impurity regions is greater than or equal to the distance between the P-type second impurity region and the P-type fourth impurity region.

21. A motor drive circuit comprising:
a P-type semiconductor substrate having an N-type first impurity region, an N-type second impurity region, an N-type third impurity region and an N-type fourth impurity region that are arranged on a major surface of the semiconductor substrate;
a first P-channel MOS transistor that is disposed in the N-type first impurity region and is connected between a first node, to which a first power source potential is supplied, and a third node connected to a first terminal of a motor to be driven;
a first N-channel MOS transistor that is disposed in the N-type second impurity region or is disposed directly in the semiconductor substrate having the N-type second impurity region, and is connected between a second node, to which a second power source potential that is lower than the first power source potential is supplied, and the third node;

a second P-channel MOS transistor that is disposed in the N-type third impurity region and is connected between the first node and a fourth node connected to a second terminal of the motor; and a second N-channel MOS transistor that is disposed in the N-type fourth impurity region or is disposed directly in the semiconductor substrate having the N-type fourth impurity region, and is connected between the second node and the fourth node, wherein a distance between the N-type first impurity region and the N-type third impurity region is smaller than a distance between the N-type first impurity region and the N-type second impurity region, smaller than a distance between the N-type third impurity region and the N-type fourth impurity region, and smaller than a distance between the N-type second impurity region and the N-type fourth impurity region.

* * * * *